US007253638B2

(12) United States Patent
Nakamura et al.

(10) Patent No.: US 7,253,638 B2
(45) Date of Patent: Aug. 7, 2007

(54) APPARATUS AND METHOD FOR CONDUCTING AN ELECTRICAL TEST ON A TERMINAL FITTING IN A CONNECTOR

(75) Inventors: Keiichi Nakamura, Yokkaichi (JP); Ryotaro Ishikawa, Yokkaichi (JP); Yutaka Noro, Yokkaichi (JP); Yutaka Kobayashi, Yokkaichi (JP); Hajime Kawase, Yokkaichi (JP); Nobuhiro Suzuki, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 11/591,950

(22) Filed: Nov. 2, 2006

(65) Prior Publication Data

US 2007/0046293 A1 Mar. 1, 2007

Related U.S. Application Data

(62) Division of application No. 11/344,777, filed on Feb. 1, 2006.

(30) Foreign Application Priority Data

Feb. 2, 2005 (JP) ............................. 2005-026670
Feb. 7, 2005 (JP) ............................. 2005-030883

(51) Int. Cl.
*G01R 31/04* (2006.01)

(52) U.S. Cl. .................................... 324/538; 324/158.1

(58) Field of Classification Search ................ 324/548, 324/538, 158.1
See application file for complete search history.

(56) References Cited

U.S. PATENT DOCUMENTS

| | | | | |
|---|---|---|---|---|
| 5,336,540 | A | 8/1994 | Kato et al. | |
| 5,564,934 | A | 10/1996 | Shimotsu | |
| 5,586,900 | A * | 12/1996 | Yagi et al. | 439/310 |
| 6,731,118 | B2 * | 5/2004 | Nishino et al. | 324/538 |
| 2002/0086580 | A1 | 7/2002 | Kurimoto et al. | |

* cited by examiner

*Primary Examiner*—Walter Benson
(74) *Attorney, Agent, or Firm*—Gerald E. Hespos; Anthony J. Casella

(57) ABSTRACT

A female connector (F) has a housing (10) with a front end and cavities (11) extend to the front end. Terminal fittings (40) are mounted in the cavities (11). A front wall (50) is mounted on the front end of the housing (10) and is formed with tab insertion holes (51) that can communicate with cavities (11). An operable surface (59A) is exposed at an end surface of the front wall (50). The front wall (50) can be moved from a full locking position to a partial locking position along the front end of the housing (10) by pushing this operable surface (59A). Portions of the end surface of the front wall (50) other than the operable surface (59A) are covered at least partly by an wall (26) of the housing (10) to limit movement of the front wall (50).

7 Claims, 22 Drawing Sheets

APPARATUS AND METHOD FOR CONDUCTING AN ELECTRICAL TEST ON A TERMINAL FITTING IN A CONNECTOR

This application is a divisional of U.S. patent application Ser. No. 11/344,777, filed Feb. 1, 2006.

BACKGROUND OF THE INVENTION

1. Field of the Invention

The invention relates to a connector, a connector testing apparatus for conducting an electrical connection test for terminal fittings in the connector and a connector testing method.

2. Description of the Related Art

U.S. Pat. No. 5,336,540 discloses a connector with a housing and cavities that penetrate the housing in forward and backward directions. Locks formed on inner walls of the cavities and retain female terminal fittings that have been inserted properly into the cavities. The female terminal fittings then are connected with tabs of male terminal fittings inserted through openings formed in the front of the housing.

The front of the housing is formed with openings for permitting the insertion of the tabs and also with mold-removal holes that are formed as part of the molding of the locks. Thus, the tabs of the male terminal fittings may erroneously enter the mold-removal holes upon connecting two connectors.

Consideration has been given to using a separate front wall with tab insertion holes. The front wall is mounted on the front of the housing so that the tab insertion holes of the front wall align with the cavities of the housing. The leading ends of the tabs then can be inserted through the tab insertion holes of the front wall and into the female terminal fittings in the cavities to avoid erroneous insertion of tabs into the mold removal holes. The front wall is fitted from below into a mounting frame on the front of the housing and is detached from the housing by sliding a jig along a slanted guiding surface at the bottom of the housing. The leading end of the jig hooks onto the front wall. The jig then is maneuvered forcibly to pull the front wall down. However, it is difficult to detach the front wall by this method, and there is a demand for a further improvement.

The present invention was developed in view of the above problem and an object thereof is to improve operability upon detaching a front wall.

SUMMARY OF THE INVENTION

The invention relates to a connector with a housing formed with at least one cavity for receiving at least one terminal fitting. A lock is formed at an inner wall of the cavity to retain the terminal fitting. A tab can be inserted into the cavity from the front for connection with the terminal fitting in the cavity. The connector further includes a front wall that can be mounted on the front of the housing. The front wall has at least one tab insertion hole that can communicate with the cavity. An operable surface is exposed on an end surface of the front wall and is used to move the front wall relative to the housing.

The front wall preferably can be shifted along the front of the housing from a mounted state to an unmounted state or to a fully removed state by pushing the operable surface at the end of the front wall. In this regard, the mounted state is a state where the tab and the terminal fitting can be connected by inserting the tab through the tab insertion hole of the front wall. The unmounted state is a state where the tab and the terminal fitting cannot be connected even if the tab is inserted into the tab insertion hole.

At least one eave or ledge preferably is provided on the front of the housing and can contact at least part of the end surface of the front wall other than the operable surface when the front wall reaches the mounted state. Thus, the front wall can be kept securely in the mounted state even if the operable surface is exposed.

The front wall preferably has an identifying construction for identifying the orientation of the front wall along vertical and/or transverse directions by the asymmetry of the outer shape thereof. Thus, an automatic machine can discriminate the orientation of the front wall along vertical and transverse directions and the front wall can be assembled by the automatic machine.

The front wall preferably has at least one jig insertion hole for receiving a detecting pin for an electrical connection test is at least partly insertable. The front wall preferably is movable between a partial locking position where the tab insertion hole is displaced from the cavity and a full locking position where the tab insertion hole communicates with the cavity. The detecting pin preferably can contact a detecting portion of the terminal fitting through the jig insertion hole when the front wall is at the partial locking position and the tab preferably can contact a contact point of the terminal fitting through the tab insertion hole when the front wall is at the full locking position. Thus, both the tab and the detecting pin can be guided precisely to the contact point and the detecting portion of the terminal fitting to improve contact reliability.

The invention also relates to a connector testing apparatus for conducting an electrical connection test for the terminal fitting accommodated in the above-described connector. The testing apparatus has a holder for receiving the connector. The apparatus further includes a detector with at least one detecting pin that is movable towards and away from the holder. The holder and the detector are brought closer together with the connector set in the holder, and the detecting pin enters the jig insertion hole to enable the electrical connection test. The holder and the detector can be separated after the test to enable the connector to be taken out. Pushing means is provided for pushing the operable surface of the connector set in the holder to push the front wall from the full locking position to the partial locking position as the holder and the detector are brought closer together. Thus, the detecting pin enters the jig insertion hole after the front wall is pushed to the partial locking position by the pushing means.

The front wall can be moved from the full locking position to the partial locking position during a series of operations of bringing the holder and the detector closer. Therefore, it is not necessary to perform a separate operation of pushing the front wall to the partial locking position, thereby improving operation efficiency.

The apparatus may further have a pushing-back means for pushing the front wall from the partial locking position back towards the full locking position as the holder and the detector are separated. Therefore, it is not necessary to perform a separate operation of pushing the front wall back towards full locking position, thereby further improving operation efficiency.

The pushing-back means preferably includes a first cam surface provided in the detector. The front wall is moved along the first cam surface to be pushed from the partial locking position back towards the full locking position. Thus, the construction of the pushing-back means can be simplified.

The pushing means preferably includes a second cam surface in the detector and a pushing member provided in or at the holder. The pushing member is moved along the second cam surface to push the operable surface, thereby pushing the front wall from the full locking position towards or substantially to the partial locking position. Thus, the construction of the pushing means can be simplified further.

The invention also relates to a connector testing method for testing the above-described connector. The method comprises setting the connector in a holder of a testing apparatus with the front wall positioned at the full locking position, moving the front wall from the full locking position to the partial locking position with the connector held in the holder, inserting a detecting pin into the housing through the jig insertion hole to conduct an electrical connection test. The front wall is moved from the full locking position to the partial locking position in the holder to conduct the test. Thus, a process prior to the testing step can be simplified.

The method may further comprise retracting the detecting pin through the jig insertion hole after the electrical connection test and then moving the front wall from the partial locking position back towards the full locking position while the connector is held in the holder. The front wall is moved back to the full locking position again after the test is completed and while the connector is still in the holder. Thus, a process after the test is simplified.

The front wall preferably is moved from the full locking position to the partial locking position as the detecting pin is brought closer to the housing and is moved back substantially to the full locking position as the detecting pin is retracted. Movements of the front wall between the partial locking position and the full locking position are linked with the forward and backward movements of the detecting pin. Thus, operation efficiency is improved further.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

A female connector in accordance with a first embodiment of the invention is identified by the letter F in FIGS. 1 to 13. The connector F has a female housing 10 that is connectable with a male housing (not shown). In the following description, a side to be connected with the male housing is referred to as the front.

Figure 6:
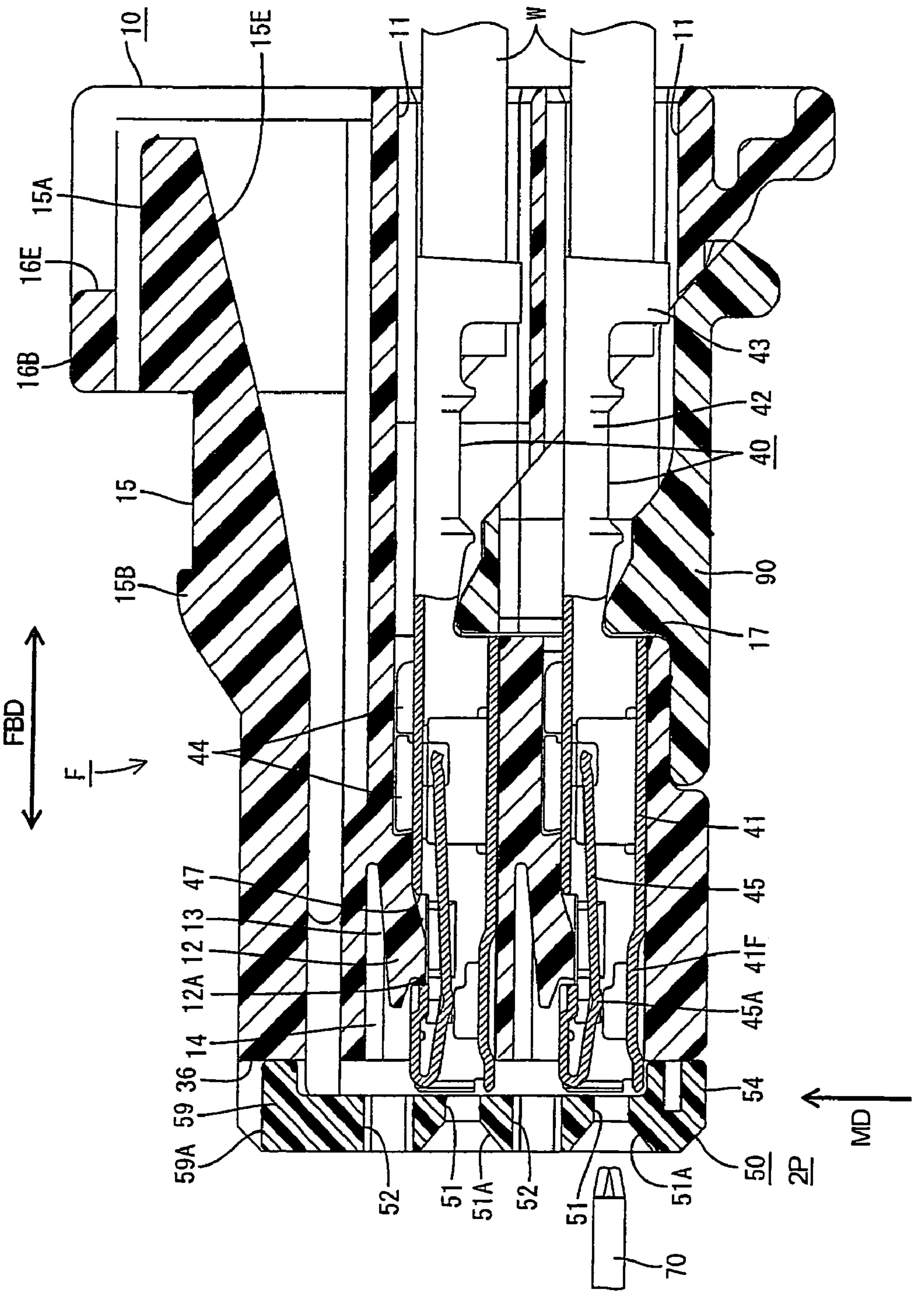
FIG. 6 is a section of the connector when the front wall is at the full locking position.

The female housing 10 is made e.g. of a synthetic resin substantially into a block preferably having a wide cross section. Cavities 11 penetrate the female housing 10 in forward and backward directions FBD and are arranged at upper and lower stages. Female terminal fittings 40 are inserted into the cavities 11 from behind, as shown in FIG. 6, and front openings of the cavities 11 permit the passage of tabs 70 of male terminal fittings accommodated in the male connector housing.

Each female terminal fitting 40 is of unitary construction and has a main portion 41, a wire barrel 42 behind the main portion 41 and an insulation barrel 43 behind the wire 42. The wire barrel 42 and the insulation barrel 43 can be crimped, bent or folded connection with a wire W. The main portion 41 is formed into a box of substantially rectangular cross section by bending, folding and/or shaping an electrically conductive metal sheet. Front and rear stabilizers 44 project from one end of the main portion 41. The stabilizers 44 can slide in contact with an escaping groove (not shown) formed substantially along one corner of the upper surface of each cavity 11. Additionally, the stabilizers 44 prevent an improperly oriented (e.g. upside-down) insertion of the female terminal fitting 40 because of an unmatched positional relationship of the stabilizers 44 and the escaping groove when the female terminal fitting 40 is inserted in an improper orientation (e.g. upside down).

A resilient contact 45 is cantilevered from the front edge of the main portion 41 and is folded back into the main portion 41. The resilient contact 45 has an angled side view and is resiliently deformable substantially up and down in a direction intersecting an intersecting direction of the mating tab 70 into the main portion 41. A contact point 45A is formed at the peak of the resilient contact 45 and the mating tab 70 is sandwiched between the contact point 45A and a receiving portion 41F that faces the contact point 45A.

Figure 3:
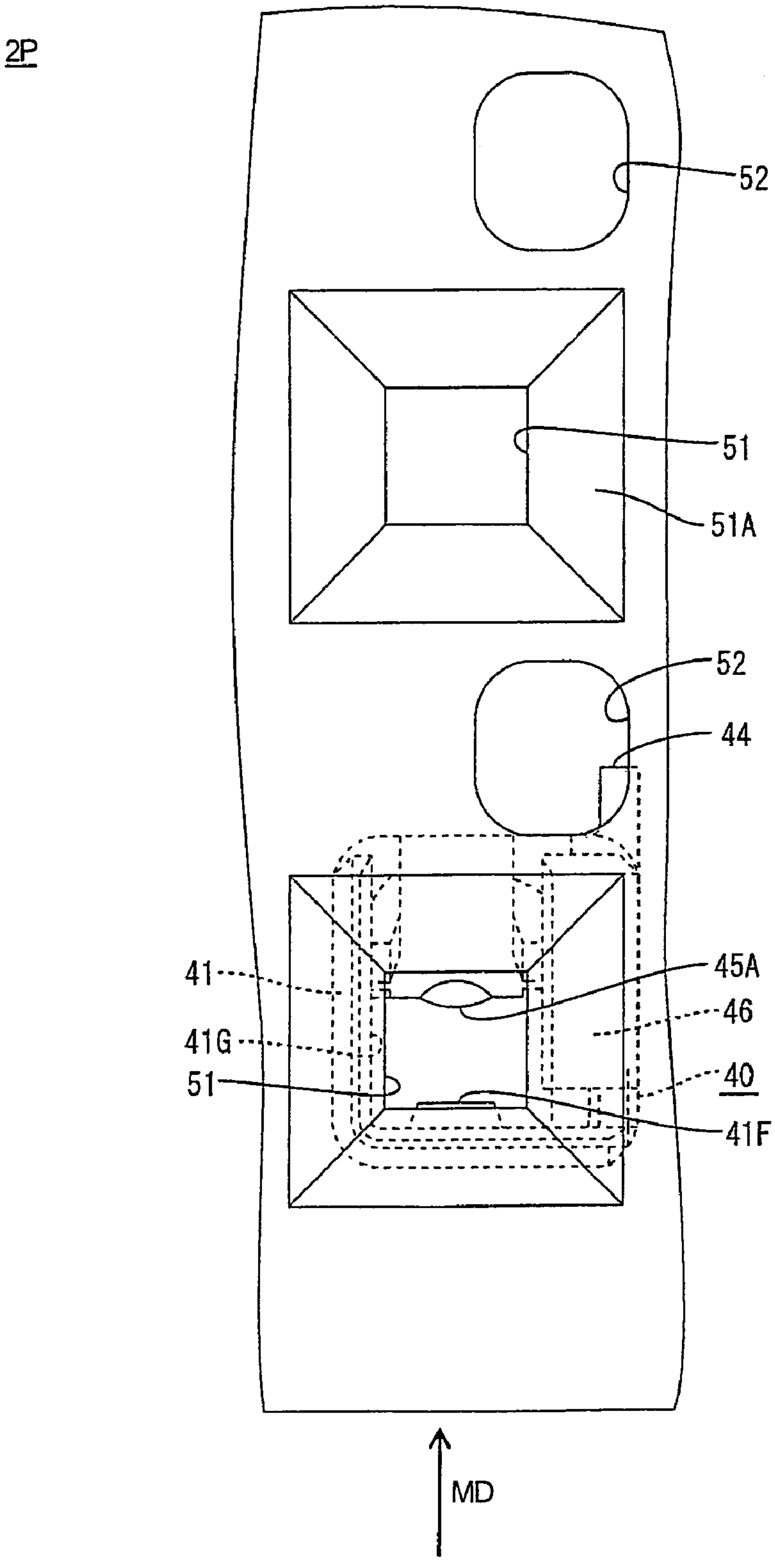
FIG. 3 is an enlarged front view showing an essential portion when the front wall is at the full locking position.

As shown in FIG. 3, the front end of each main portion 41 has a tab insertion opening 41G at a position offset from a widthwise center towards a first side, and a detecting plate 46 at the projecting in from the second side. The detecting plate 46 has a vertical long rectangular front view and is formed by bending a forwardly projecting portion of the main portion 41 substantially in substantially at right angle. The base end of the resilient contact piece 45 appears substantially adjacent the detecting plate 46 when the female terminal fitting 40 is viewed from the front. The leading end of a detection probe 60 can be brought into contact with the detecting plate 46 when conducting an electrical connection test.

As shown in FIG. 6, a lock 12 is formed unitarily in each cavity 11 of the female housing 10. The lock 12 cantilevers forward from the upper surface of the cavity 11 and is resiliently deformable up and down in directions intersecting an insertion direction of the terminal fitting into the cavity 11. A locking projection 12A is formed at the free end of the lock 12 and projects towards the cavity 11. A deformation space 13 is defined above of the lock 12 and at a side opposite a terminal fitting arranging space. A mold-removal hole 14 is left in the front of the female housing 10 as the lock 12 is formed. The mold removal hole 14 is present before the lock 12 and the deformation space 13, and communicates with the cavity 11. The lock 12 interferes with the female terminal fitting 40 during the insertion of the female terminal fitting 40 into the cavity 11. Thus, the lock 12 is pushed up towards the deformation space 13. The lock 12 is restored resiliently so that the locking projection 12*a* engages a locking hole 47 formed in the ceiling plate 41*a* when the female terminal fitting 40 is inserted properly, thereby retaining the female terminal fitting 40.

A lock arm 15 is formed at a widthwise intermediate position of the upper surface of the female housing 10. The lock arm 15 cantilevers back along the forward and backward directions FBD with the base end of the lock arm 15 supported on the front end of the upper surface of the female housing 10. An operable portion 15A is provided close to the free end of the lock arm 15 and a lock projection 15B is formed at a longitudinal intermediate position of the upper surface of the lock arm 15. The lock projection 15B engages the male connector housing to hold the housings connected.

The lower surface of the lock arm 15 has a slanted surface 15E behind the substantially longitudinal middle position. A rear area of the upper surface of the female housing 10 facing the slanted surface 15E is slightly recessed as compared to a front area, so that a sufficient deformation space for the lock arm 15 can be ensured between the rear area of the lock arm 15 and the rear area of the upper surface of the female housing 10. The deformation spaces 13 for the locks 12 are formed inside the front area of the upper surface of the female housing 10 so that the height of the female housing 10.

Figure 1:
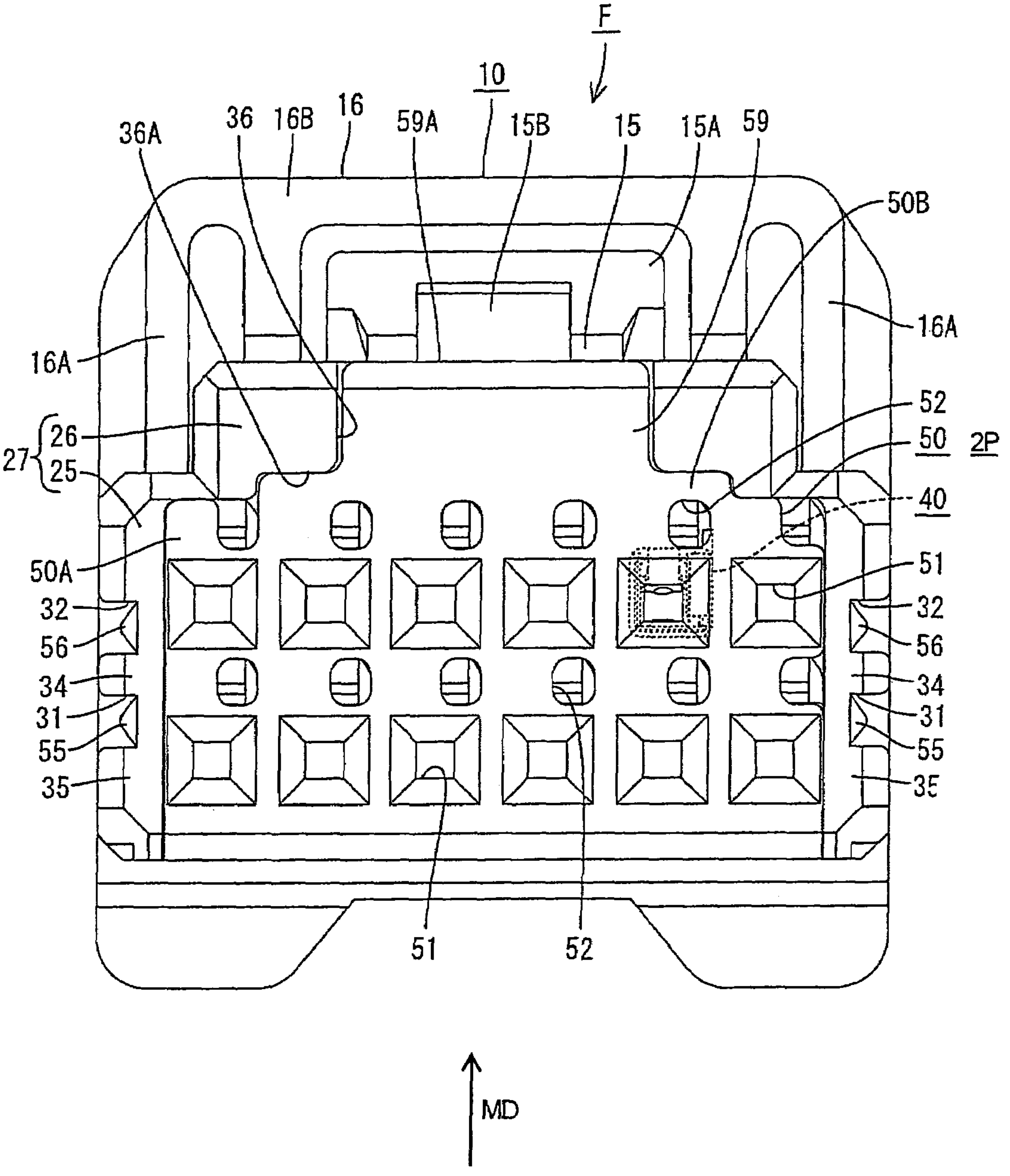
FIG. 1 is a front view of a connector according to a first embodiment of the invention when a front wall is at a full locking position.

A turning preventing wall 16 projects from the upper surface of the female housing 10 at least partly surrounds the operable portion 15A of the lock arm 15, as shown in FIG. 1. The turning preventing wall 16 is substantially bridge-shaped and is defined by two legs 16A connected with the opposite ends of the upper surface of the female housing 10 and a ceiling portion 16B spanning between the legs 16A. The operable portion 15A is at least partly arranged inside the turning preventing wall 16. The turning preventing wall 16 prevents the lock arm 15 from getting caught by external matter such as by the wire W to be turned up or deflected. The ceiling portion 16B of the turning preventing wall 16 is recessed to form a operating hole 16E enabling the lock arm 15 to be operated, e.g. by finger pushing the operable portion 15A.

As shown in FIG. 6, a retainer mount hole 17 is formed in the bottom surface of the female housing 10 for receiving a retainer 90. The retainer mount hole 17 is formed in three surfaces of the female housing 10 to extend from the bottom surface to the opposed side surfaces adjacent to the bottom surface. The retainer mount hole 17 has a depth to divide the cavities 11 at the upper and lower stages into front and rear parts.

The retainer 90 is made e.g. of a synthetic resin similar to the female housing 10, and is movable between partial and full locking positions. The retainer 90 at the partial locking position is fit lightly into the retainer mount hole 17 to permit the insertion and withdrawal of the female terminal fittings 40. The full locking position is reached by pushing the retainer 90 obliquely forward so that the retainer 90 is engageable with the rear edges of the main portions 41 of the female terminal fittings 40.

As shown in FIG. 1, a mounting frame 27 is formed on the front of the female housing 10 and is defined by side walls 25 and an upper wall 26. A flat plate-shaped front wall 50 made e.g. of a synthetic resin is mounted to the front of the female housing 10 and into the mounting frame 27. More particularly, the front wall 50 is mounted from below and along a mounting direction MD that is substantially normal to the forward and backward directions FBD. The upper wall 26 of the mounting frame 27 defines left and right eaves separated by a guide groove 36.

The front wall 50 has tab insertion holes 51 corresponding in number and location to the cavities 11. Thus, the tab insertion holes 51 can communicate with the corresponding cavities 11 at the upper and lower stages. The front wall 50 also has jig insertion holes 52 that can communicate with the mold-removal holes 14 left as the locks 12 are formed. The jig insertion holes 52 are arranged at upper and lower stages and have an offset positional relationship with the respective tab insertion holes 51. The jig insertion hole 52 at the left end in FIG. 1 of the upper stage makes an opening in the upper end of the rectangular plate-shaped main body 50A.

Figure 5:
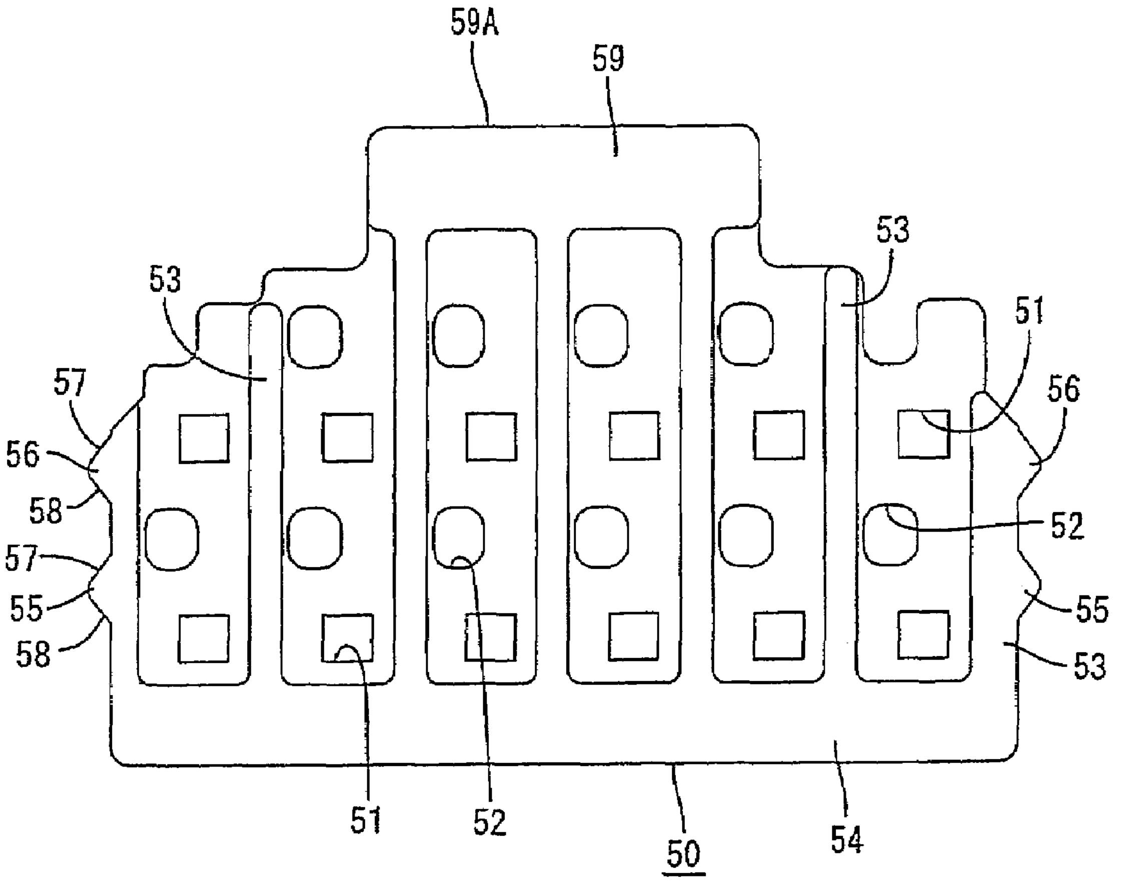
FIG. 5 is a rear view of the front wall.

As shown in FIG. 5, vertical ribs 53 are formed substantially side by side on the rear surface of the front wall 50 and facing the female housing 10. The vertical ribs 53 can connect with partition walls (not shown) partitioning the cavities 11 in the female housing 10. A base 54 bulges out backward from the bottom end of the rear surface of the front wall 50, and the base ends of the vertical ribs 53 are coupled to the upper surface of this base 54.

Two first latches 55 are formed at the opposite side edges of the front wall 50 at substantially the same height, and two second latches 56 are formed above and at a specified distance to the first latching portions 55. The first and second latches 55, 56 are connected with the vertical ribs 53 on the opposite lateral end surfaces of the front wall 50, and have substantially the same thickness as the vertical ribs 53. The first and second latches 55, 56 have identical shapes and sizes, with slanted upper surfaces 57 inclined down toward the projecting ends and the slanted lower surfaces 58 inclined up toward the projecting ends.

Figure 2:
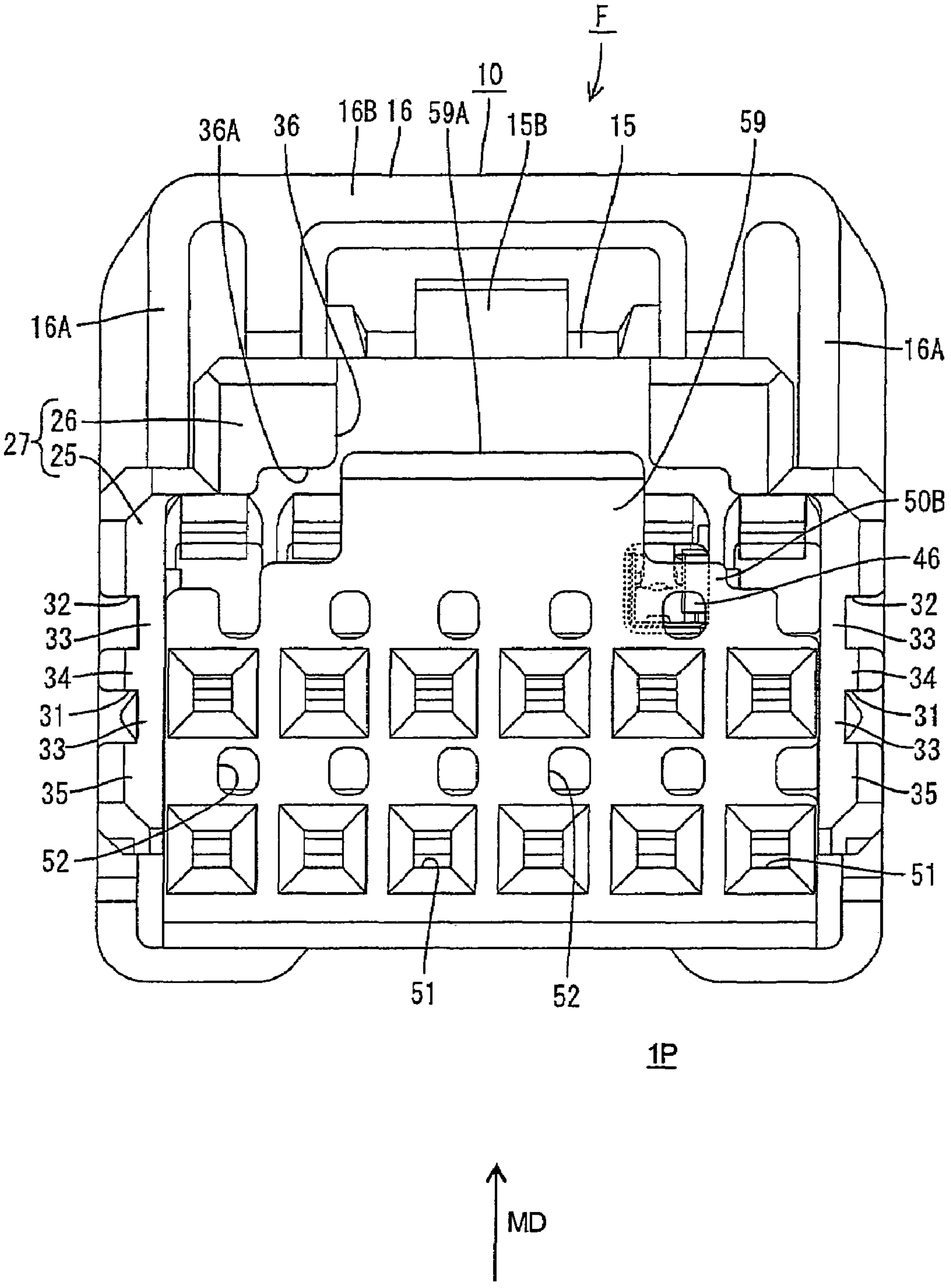
FIG. 2 is a front view of the connector when the front wall is at a partial locking position.

On the other hand, as shown in FIG. 2, two first receiving portions 31 are formed on the opposite side walls 25 of the mounting frame 27 at substantially the same height, and two second receiving portions 32 are formed at substantially the same height above and at a specified distance from the first receiving portions 31. The first and second receiving portions 31, 32 are holes of identical shape and size that penetrate the side walls 25 in thickness direction and can receive the respective first and second latches 55, 56. Front parts of the first and second receiving portions 31, 32 are partitioned by disengagement preventing walls 33 formed by thinning the outer surfaces of the side walls 25 to prevent the mounted front wall 50 from coming off forward.

The front wall 50 is held at the partial locking position 1P by resiliently fitting the second latches 56 into the first receiving portions 31 as shown in FIG. 2 and is held at the full locking position 2P by resiliently fitting the second latches 56 into the second receiving portions 32 and the first latches 55 into the first receiving portions 31 as shown in FIG. 1. As a result, the front wall 50 is movable up and down along the mounting direction MD and substantially normal to the forward and backward directions FBD between the partial locking position 1P and the full locking position 2P. In the process of moving the front wall 50 from the partial locking position 1P to the full locking position 2P, the second latches 56 move over partition walls 34 between the first and second receiving portions 31, 32 while resiliently pushing the partial walls 34 out and the first latches 55 move over end walls 35 below the first receiving portions 31 while pushing the end walls 35 out. In this case, the first and/or second latches 55, 56 can smoothly move over the partition walls 34 and the end walls 35 by bringing the slanted surfaces 57 as the upper surfaces of the first and second latches 55, 56 into sliding contact with the lower surfaces of the partition walls 34 and the end walls 35.

When the front wall 50 reaches the full locking position 2P, the front surface of the front wall 50 is substantially continuous and flush with the front surface of the mounting frame 27 and the bottom end surface of the front wall 50 is substantially continuous and flush with the bottom surface of the female housing 10. Further, when the front wall 50 reaches the full locking position, the tab insertion holes 51 communicate with the cavities 11 and the jig insertion holes 52 communicate with the mold-removal holes 14. Accordingly, if the tabs 70 are inserted into the tab insertion holes 51 in this state, the leading ends of the tabs 70 are inserted through the tab insertion holes 51 into the main portions 41 of the female terminal fittings 40 in the cavities 11 and contact the resilient contacts 45 in the main portions 41 to establish electrical connections therebetween. An unlocking jig (not shown) for disengaging the lock 12 can be inserted through the jig insertion hole 52 from the front. Thus, the leading end of the jig enters the mold-removal hole 14 through the jig insertion hole 52 and contacts the front surface of the locking projection 12A at the leading end of the lock 12. As a result the lock 12 can be pushed up towards the deformation space 13 in the unlocking direction.

Figure 4:
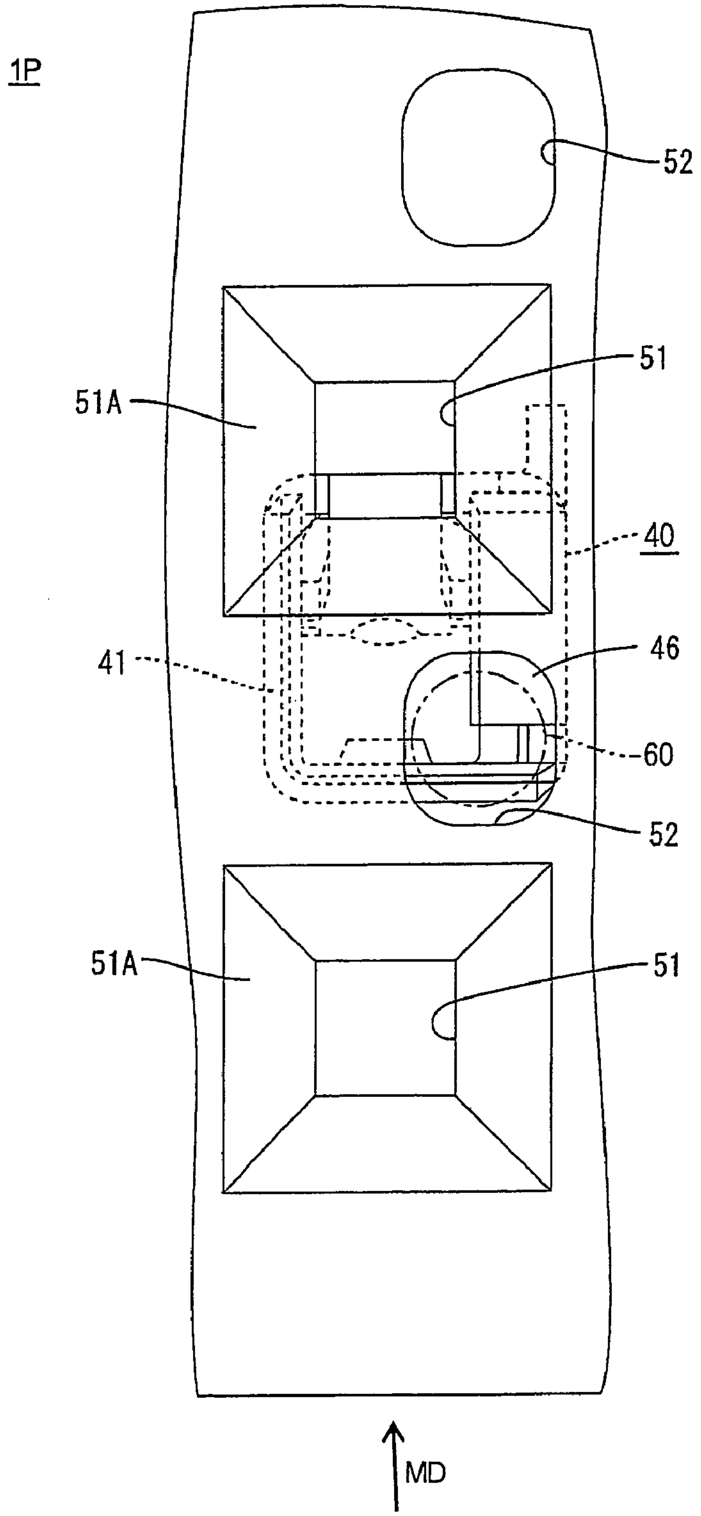
FIG. 4 is an enlarged front view showing an essential portion when the front wall is at the partial locking position.
Figure 7:
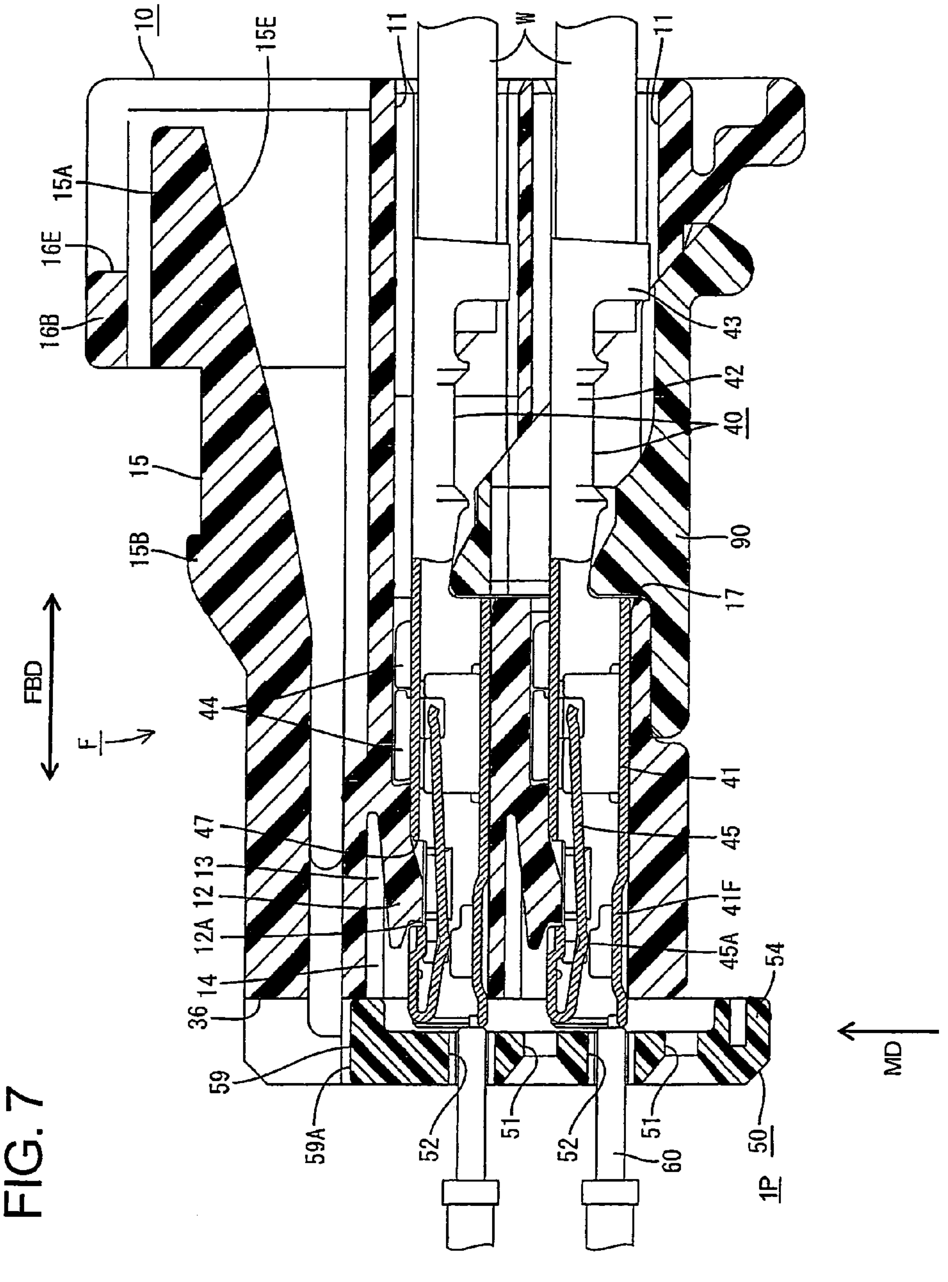
FIG. 7 is a section when detecting pins contact female terminal fittings with the front wall held at the partial locking position.

Contrary to this, when the front wall 50 is at the partial locking position 1P, the tab insertion holes 51 are displaced from the cavities 11, as shown in FIGS. 2 and 4. Thus, the tabs 70 cannot enter the main portions 41 of the female terminal fittings 40 even if inserted into the displaced tab insertion holes 51. Further, the front lower parts of the detecting plates 46 of the female terminal fittings 40 face the jig insertion holes 52. Thus, the detection probes 60 can be inserted into the jig insertion holes 52 from the front as shown in FIG. 7, and can contact the front lower parts of the detecting plates 46. Therefore, whether the female terminal fittings 40 are inserted properly in the cavities 11 can be detected based on electrical connections between the detection probes 60 and the detecting plates 46. The testing apparatus 80 for conducting this test and a testing method are described in detail later.

The front wall 50 has a pushable portion 59 that can be pushed to move the front wall 50 from the full locking position 2P to the partial locking position 1P. This pushable portion 59 is substantially rectangular in plan view and the opposite corners at the upper end thereof are rounded. The pushable portion 59 is at the upper end surface, or forward end as seen in the mounting direction MD, of the main body 50A of the front wall 50. As shown in FIG. 6, the rear surface of the pushable portion 59 bulge out to be substantially flush with the rear surface of the base portion 54 and the rear surfaces of the vertical ribs 53. Added portions 50B are provided at lateral sides of the bottom ends of the opposite sides of the pushable portion 59, and project from the upper end of the main body 50A of the front wall 50 by a distance shorter than the pushable portion 59. An operable surface 59A is defined at the upper end surface of the pushable portion 59 and is used for detaching the front wall 50. The operable surface 59A is substantially flat and exposed without being covered by the mounting frame 27, and has a longer dimension along forward and backward directions FBD than the main body 50A of the front wall member 50.

On the other hand, the guide groove 36 vertically penetrates the upper wall 26 at the front end of the base end of the lock arm 15. The guide groove 36 has an opening width only slightly larger than the width of the pushable portion 59, and the pushable portion 59 is insertable into the guide groove 36 from below and in the mounting direction MD. Receiving grooves 36A are formed at lateral sides of the bottom ends of the opposite sides of the guide groove 36 and communicate with the guide groove 36. The added portions 50B can enter the receiving grooves 50B.

The pushable portion 59 is movable in the mounting direction MD along the front surface of the female housing 10. More particularly, the guide groove 36 guides movement of the front wall 50 between the partial locking position 1P and the full locking position 2P. The operable surface 59A is at the entrance of the guide groove 36 when the front wall 50 is at the partial locking position 1P shown in FIG. 2. The pushable portion 59 fits entirely in the guide groove 36 and the operable surface 59A is substantially continuous with the upper surface of the upper wall 25 along the width direction at the upper opening of the guide groove 36 when the front wall 50 reaches the full locking position 2P shown in FIG. 1. The main body 50A and the added portions 50B of the front wall 50 contact the upper wall 26 to hinder any further upward movement of the front wall 50 in the mounting direction MD when the front wall 50 reaches the full locking position 2P. The operable surface 59A can be pushed down and opposite to the mounting direction MD in this state. Thus, the front wall 50 starts moving from the full locking position 2P to the partial locking position 1P. In this moving process, the slanted surfaces 58 at the lower surfaces of the first and/or second latches 55, 56 slide in contact with the respective upper surfaces of the partition walls 34 and the end walls 35. Thus, the first and/or second latches 55, 56 can move easily over the partition walls 34 and the end walls 35.

When the front wall 50 is at the partial locking position 1P, the insufficient insertions of the female terminal fittings 40 and the presence or absence of the female terminal fittings 40 can be tested as described above. The testing apparatus 80 used for this test has a holder 81 arranged at one side for holding the connector F, and a detector 82 at the other side and substantially opposed to the holder 81.

The detector 82 is movable forward and backward towards and away from the holder 81 along a connecting direction CD by a specified stroke with respect to the holder 81 by operating a lever (not shown). The detector 82 has a plurality of detecting pins 60 at positions corresponding to the jig insertion holes 52 of the front wall 50 at the partial locking position 1P. The detecting pins 60 can enter the corresponding cavities 11 through the jig insertion holes 52 to contact the detecting plates 46 of the female terminal fittings 40 in the cavities 11 as the detector 82 approaches the holder 81. The detecting pins 60 are connected via lead wires (not shown) with an electrical connection testing unit (not shown), which judges whether the detecting pins 60 are in contact with the female terminal fittings 40, thereby electrically detecting whether the female terminal fittings 40 are inserted to proper depths and/or whether the female terminal fittings 40 are inserted and/or whether the female terminal fittings 40 are arranged in the proper pattern in the cavities 11. In this embodiment, the detecting pins 60 contact the detecting plates 46 of the female terminal fittings 40 without contacting the resilient contacts 45. This can prevent the resilient contacts 45 from being buckled or plastically deformed, thereby ensuring contact reliability with the tabs 70.

The holder 81 includes a supporting block 84 projecting forward from a substantially vertical back wall 83. The supporting block 84 is recessed to form a connector fixing portion 85 for receiving the connector F from below. A front wall of the supporting block 84 before the connector fixing portion 85 has jig introducing holes 86 at positions corresponding to the respective female terminal fittings 40 in the cavities 11. The jig introducing holes 86 are displaced from the jig insertion holes 52 when the front wall 50 is at the full locking position 2P, but communicate with the jig insertion holes 52 when the front wall 50 is at the partial locking position 1P. A pusher 87 is arranged at a position on the holder 81 corresponding to the operable surface 59A of the front wall member 50 for pushing the operable surface 59A.

The pusher 87 is vertically displaceable along the mounting direction MD of the front plate 50 between a standby position SP and a pushing position PP, and includes a block 87A, a main pushing portion 87B projecting down from the block 87A, and a spring 87E at least partly surrounding the main pushing portion 87B. A flange 87F bulges out from the block 87A, and a slanted guiding surface 87G slopes up towards the back at an upper part of the front surface of the block 87G.

The supporting block 84 is formed with an accommodating recess 88 for accommodating the pushing member 87. The inner walls of the accommodating recess 88 in the holder 81 are comprised of a first stepped surface 88A that contacts the upper surface of the flange 87F at the standby position SP, a second stepped surface 88B that contacts the lower surface of the flange 87F at the pushing position PP, and a third stepped surface 88E that holds the spring portion 87E in cooperation with the bottom surface of the block 87A. A guiding hole 89 is formed below the third stepped surface 88E and communicates with the connector fixing portion 85. The main pushing portion 87B can be introduced through the guiding hole 89. The operable surface 59A of the front wall 50 is at a position corresponding to the guiding hole 89 when the connector F is set in the connector fixing portion 85.

On the other hand, the detector 82 is recessed to form a receiver 91 for receiving the supporting block 84 as the holder 81 approaches. Detecting pins 60 project from the back surface of the receiver 91 and towards the holder 81. A raised portion 92 projects at an opening side of the bottom inner wall of the receiver 91 in the detector 82, and the rear surface of the raised portion 92 is formed into a slanted first cam surface 93 that slopes up towards the front. This first cam surface 93 is at a position facing a bottom part of the rear surface of the front wall 50 pushed down to the partial locking position 1P, and functions to push the front wall 50 up from the partial locking position 1P to the full locking position 2P by coming into sliding contact with the bottom end of the front wall 50 as the detector 82 is moved away from the holder 81. An escaping space 94 is defined in the receiver 91 behind the first cam surface 93 and receives the front wall 50 pushed down to the partial locking position 1P.

A slanted second cam surface 95 is formed at an opening position of the upper inner wall of the receiver 91 in the detector 82. The second cam surface 95 slopes up towards the front and is before the front end of the raised portion 92. As described in detail below, the second cam surface 95 faces the guiding surface 87G when the pusher 87 is at the standby position SP, and pushes the front wall 50 from the full locking position 2P to the partial locking position 1P by sliding in contact with the guiding surface 87G of the pusher 87 as the detector 82 approaches the holder 81. The second cam surface 95 has an angle of inclination substantially equal to that of the first cam surface 93 and more moderate than that of the guiding surface 87G. A preventing surface 96 is defined on the upper inner wall of the receiver 91 behind the second cam surface 95 for keeping the pushing member 87 pushed. The preventing surface 96 is substantially horizontal and parallel to the connecting direction CD of the holder 81 and the detector 82 and is at substantially the same height as the bottom end of the second cam surface 95.

The front wall 50 first is fit loosely into the mounting frame 27 of the female housing 10 from below and in the mounting direction MD. In this state, the front wall 50 is pushed up in the mounting direction MD to let the second latches 56 thereof resiliently move over the end walls 35 of the female housing 10 and to fit the second latches 56 into the first receiving portions 31. Thus, the front wall 50 can reach the partial locking position 1P as shown in FIG. 2. The front wall 50 can reach the full locking position 2P, as shown in FIG. 1, by pushing the front wall 50 up in the mounting direction MD to fit the second latches 56 into the second receiving portions 32 and to fit the first latches 55 into the first receiving portions 31. Subsequently, the retainer 90 is set in the female housing 10 at the partial locking position.

Then, the female terminal fitting 40 is inserted into the cavity 11 from behind to be locked resiliently by the lock 12. At this time, a part of the rear surface of the front wall 50 around the tab insertion hole 51 faces the front edge of the female terminal fitting 40. The retainer 90 is pushed obliquely up and forward to the full locking position after all of the female terminal fittings 40 have been inserted for doubly locking the female terminal fittings 40. In this state, the tab insertion holes 51 of the front wall 50 substantially align with the tab insertion openings 41G of the main portions 41 of the female terminal fittings 40, and the jig insertion holes 52 of the front wall 50 communicate with the mold-removal holes 14 of the female housing 10.

The mating male housing then can be connected from the front. As a result, tabs 70 of the male terminal fittings pass through the tab insertion holes 51 of the front wall 50 and enter the main portions 41 of the female terminal fittings 40, as shown in FIG. 6. The tabs 70 may be misaligned due to a positioning error of the two housings. However, the misaligned tabs 70 merely contact the opening edges of the tab insertion holes 51 and will not enter the mold-removal holes 14 that communicate with the cavities 11. In addition, slanted surfaces 51A are formed at least partly around the tab insertion holes 51 in the front surface of the front wall 50 for guiding the tabs 70. Thus, the positions of the tabs 70 are corrected to securely guide the tabs 70 into the main portions 41 of the female terminal fittings 40.

The female terminal fitting 40 can be removed by returning the retainer 90 to the partial locking position. The unlocking jig then is inserted through the jig insertion hole 52 from the front and enters the mold-removal hole 14 so that the leading end of the jig can contact with the leading end of the lock 12. The jig displaces the lock 12 towards the deformation space 13 so that the female terminal fitting 40 can be withdrawn.

Figure 8:
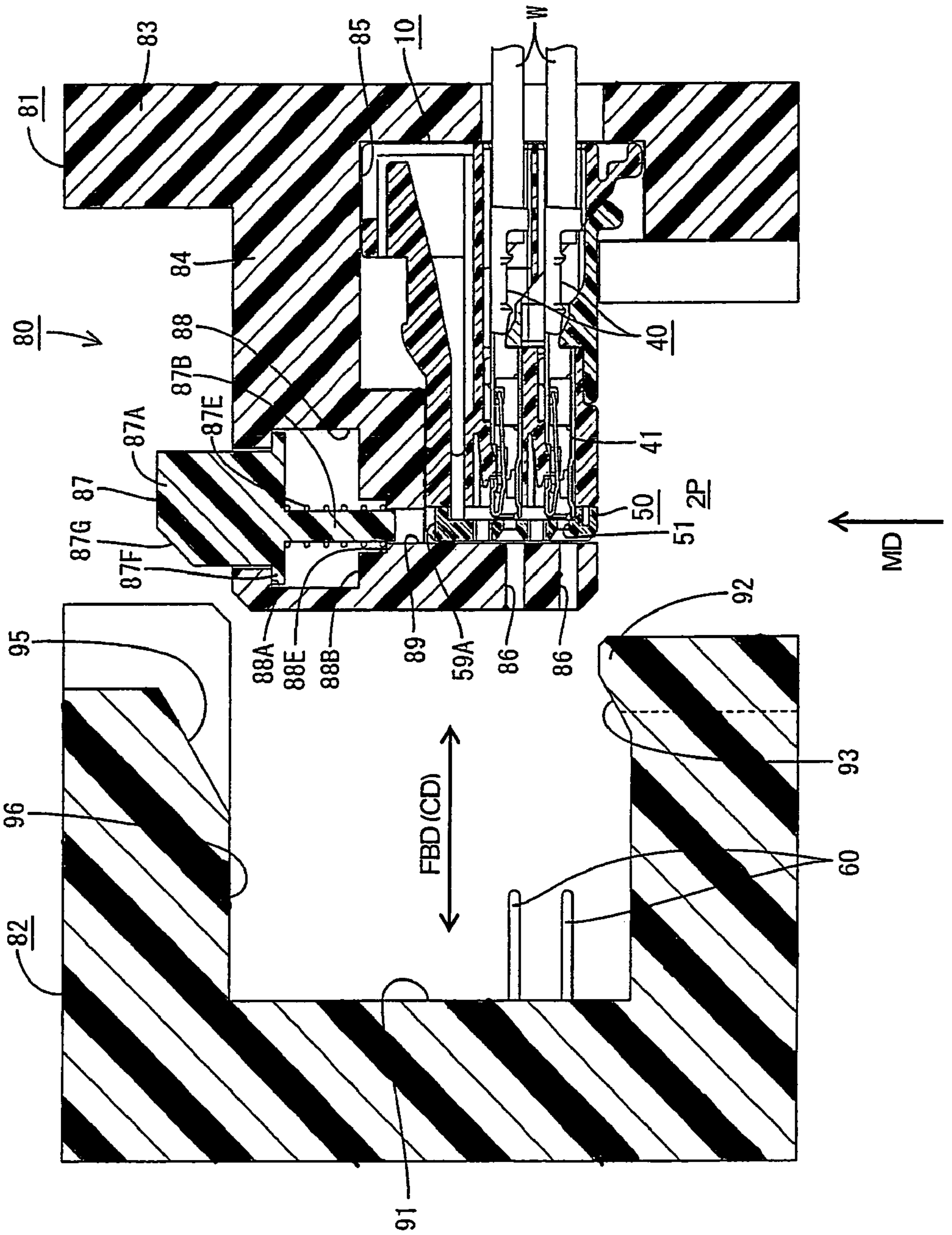
FIG. 8 is a section when the connector is set in a holder in a testing apparatus.

An electrical connection test can be conducted by the testing apparatus 80 with the female terminal fittings 40 in the cavities 11 of the female housing 10. To this end, the female housing 10 is inserted into the connector fixing portion 85 of the holder 81. Then, as shown in FIG. 8, the operable surface 59A of the front wall 50 faces the guiding hole 89 of the supporting block 84, and the pusher 87 faces the second cam surface 95 of the detector 82 while projecting up from the upper surface of the supporting block 84.

Figure 9:
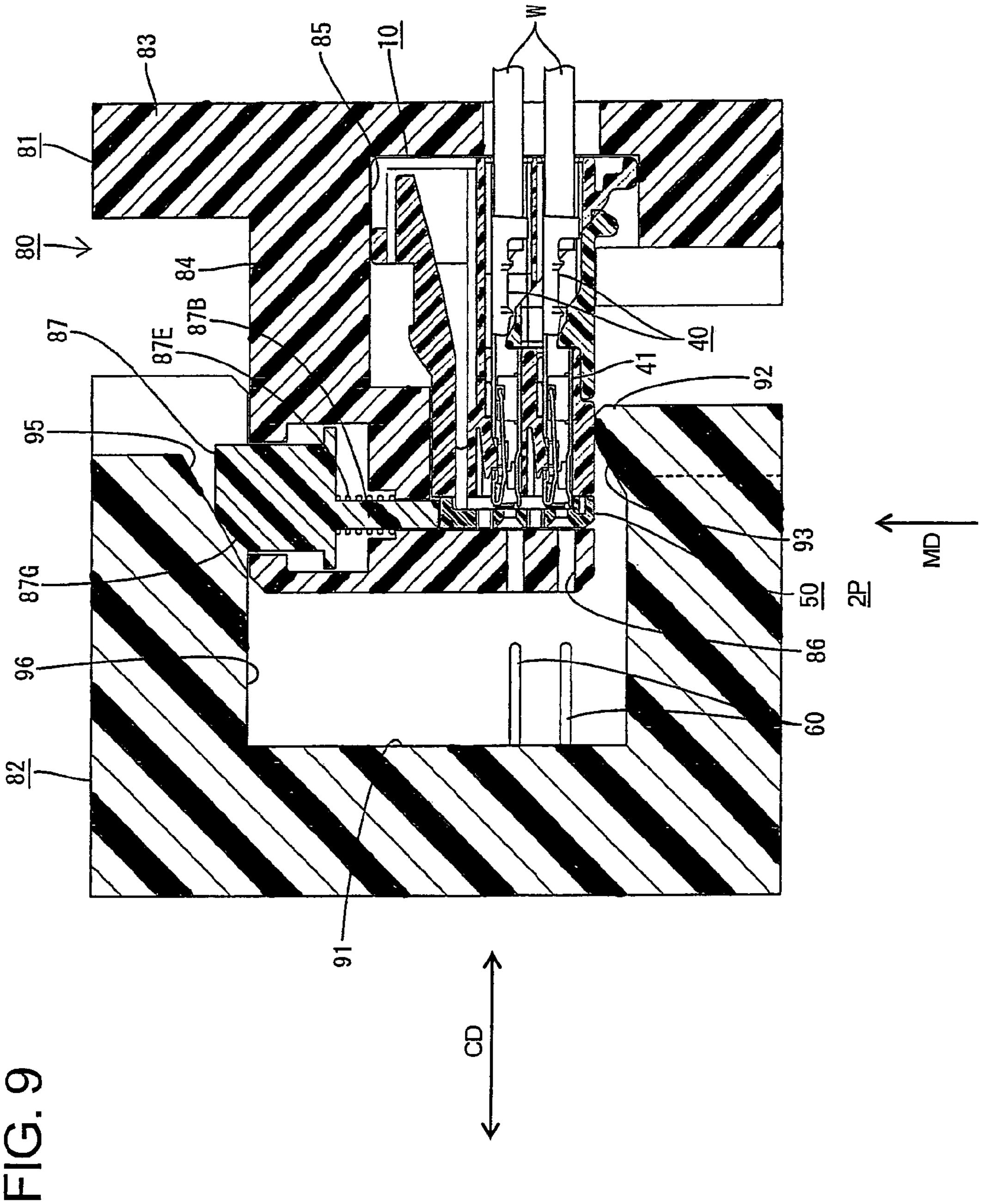
FIG. 9 is a section when a detecting unit is brought closer to the holder to bring a pushing member into contact with an operable surface.
Figure 10:
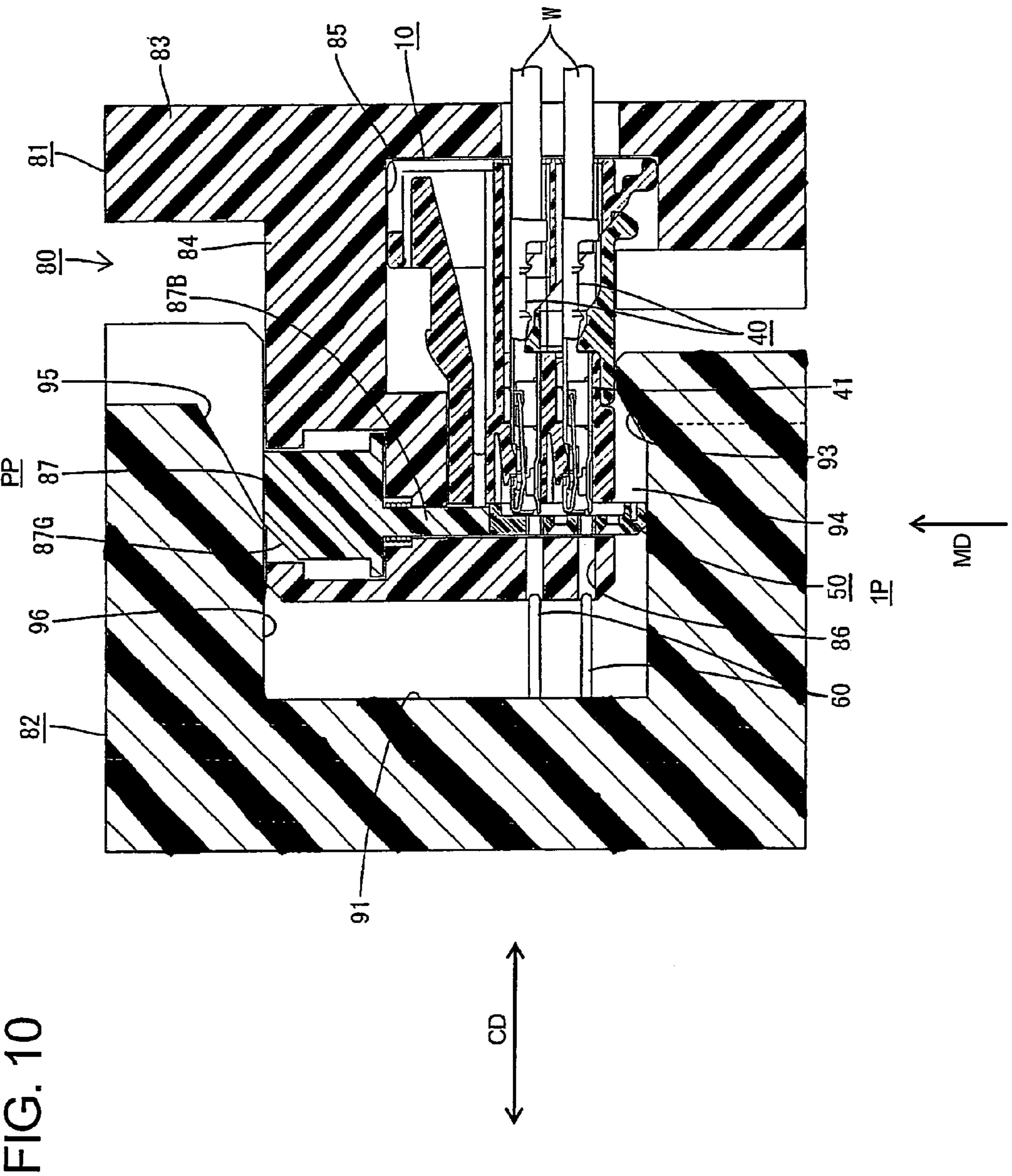
FIG. 10 is a section when the detecting unit is brought further closer to the holder to push the front wall to the partial locking position.

In this state, the entire detector 82 is brought closer to the holder 81 along the connecting direction CD. By this approaching operation, the second cam surface 95 contacts the guiding surface 87G of the pusher 87 with the supporting block 84 loosely fit in the opening of the receiver 91. A further movement of the detector 82 causes the guiding surface 87 to move down and opposite to the mounting direction MD along the second cam surface 95. Thus, the pusher 87 is pushed down opposite to the mounting direction MD and towards the pushing position PP while compressing the spring 87E. Then, as shown in FIG. 9, the leading end of the main pushing portion 87B of the pusher 87 contacts the operable surface 59A through the guiding hole 89. As the detector 82 is moved further, the pusher 87 is pushed farther down and opposite to the mounting direction MD. Thus, the front wall 50 is released from the full locking position 2P and moves towards the partial locking position 1P by this pushing force. A portion of the front wall 50 that projects down from the bottom surface of the female housing 10 escapes into the escaping space 94, as shown in FIG. 10.

Figure 11:
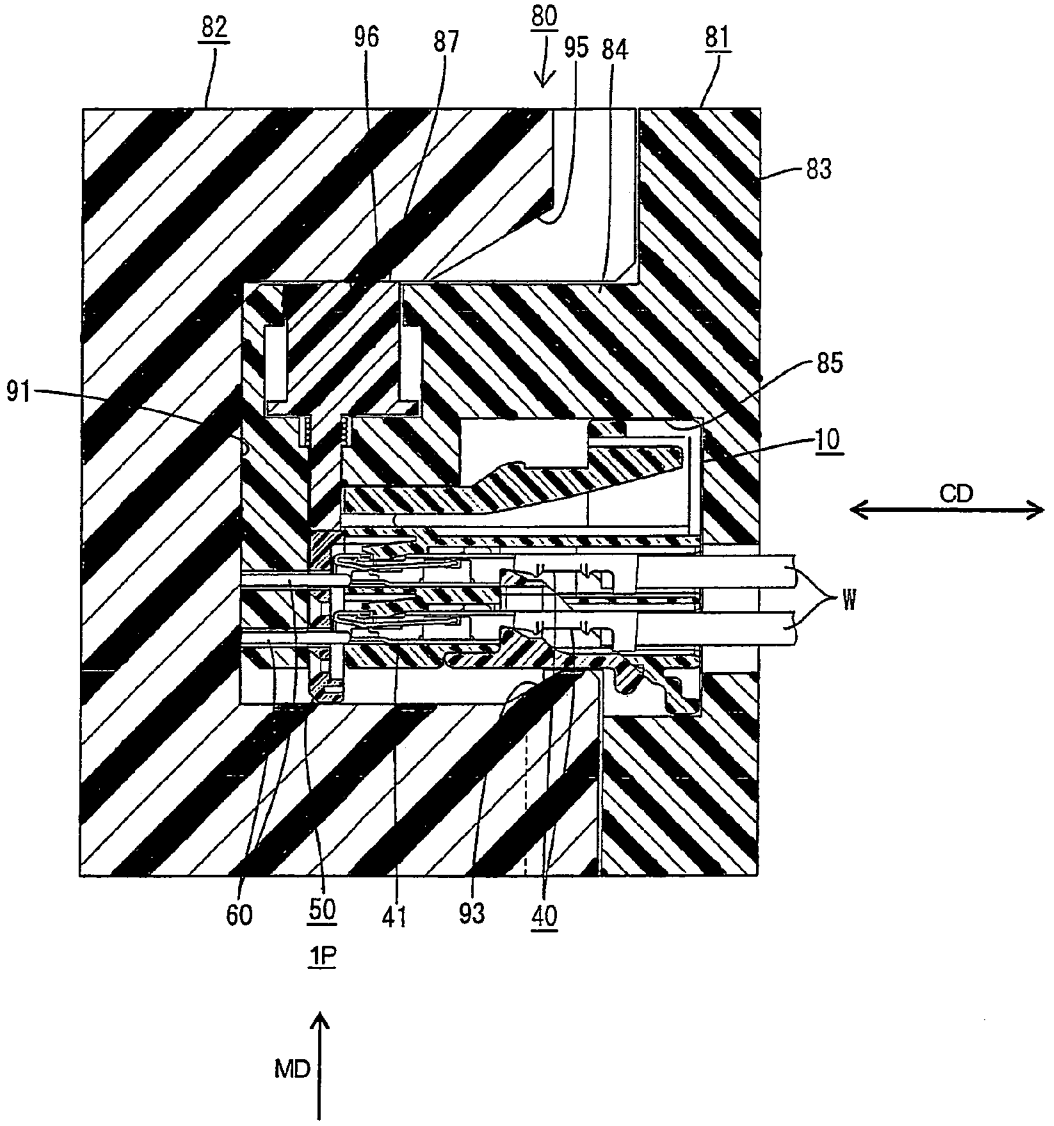
FIG. 11 is a section when the detecting unit reaches a detecting position to bring the detecting pins into contact with the female terminal fittings.

The leading ends of the detecting pins 60 start entering the jig introducing holes 86 of the supporting block 84 almost simultaneously with the arrival of the front wall 50 at the partial locking position 1P. As the detecting unit 82 is moved further, the leading ends of the detecting pins 60 enter the jig insertion holes 52 of the front wall 50 and contact the female terminal fittings 40 in the cavities 11. At this time, a testing circuit is formed by the contact of the female terminal fittings 40 and the detecting pins 60 if the female terminal fittings are inserted properly in the cavities 11, as shown in FIG. 11. The testing circuit detects whether the female terminal fittings 40 are inserted insufficiently or distributed incorrectly. The front surface of the supporting block 84 at the testing position contacts the back surface of the receiver 91 and the pusher 87 is prevented from returning to the standby position SP by the preventing surface 96 while receiving a biasing force of the spring 87E.

Figure 12:
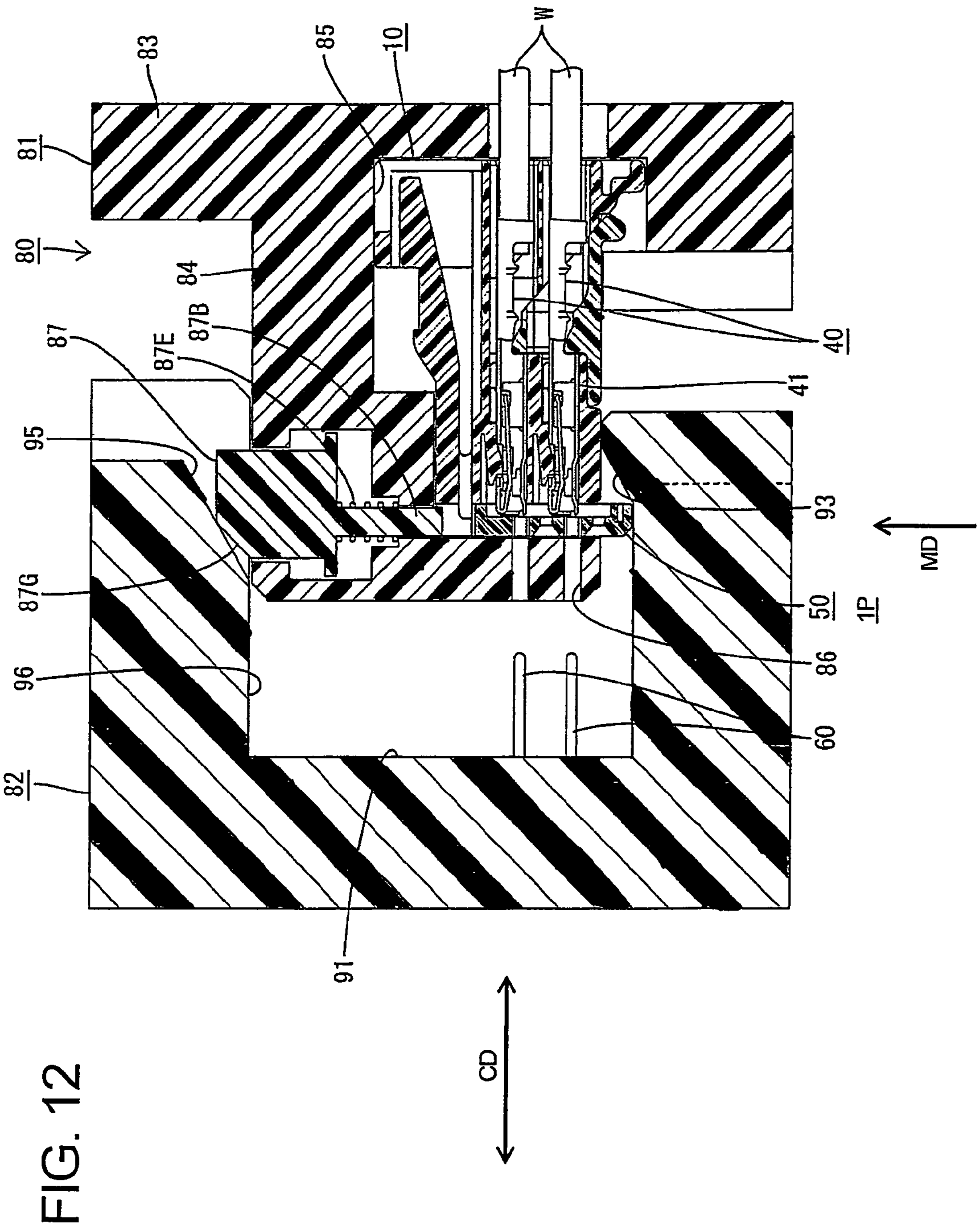
FIG. 12 is a section showing an intermediate stage of pushing the pushing member toward a standby position in the process of separating the detecting unit from the holder.
Figure 13:
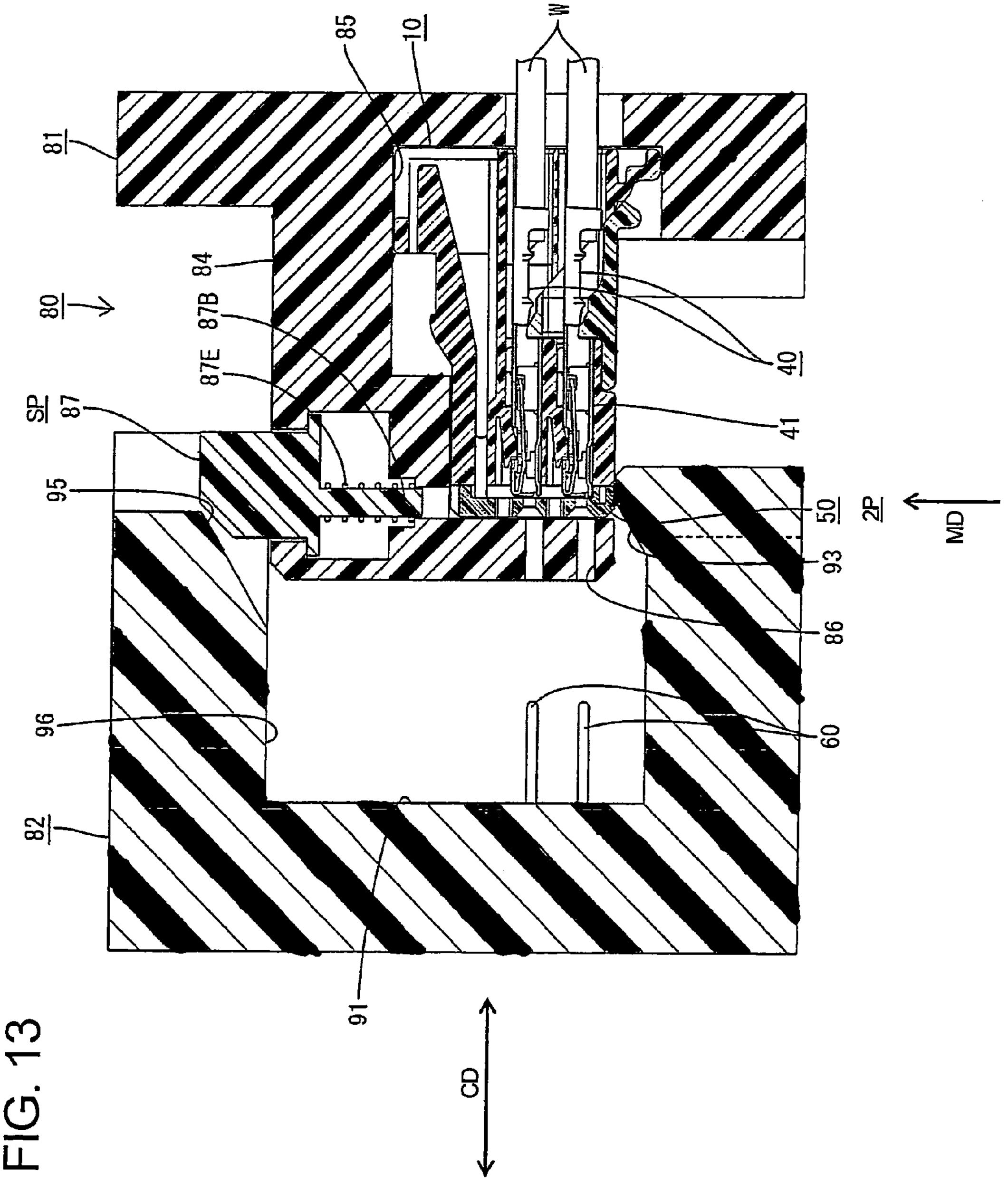
FIG. 13 is a section when the pushing member is pushed up to the standby position and the front wall is pushed back to the full locking position immediately before the detecting unit is separated from the holder.

The detector 82 is moved along the connecting direction CD and away from the holder 81 after the test. Thus, the bottom end of the front wall 50 moves onto the first cam surface 93 and the front wall 50 moves up in the mounting direction MD along the first cam surface 93. Prior to a movement of the front wall 50 along the first cam surface 93, the pusher 87 is moved towards the standby position SP substantially along the second cam surface 95 by the biasing force of the spring 87E and the front wall 50 is freed from the pushing force as shown in FIG. 12. In this way, the front wall 50 is released from the partial locking position 1P and moves towards the full locking position 2P. Thereafter, the detector 82 is moved away from the holder 81, as shown in FIG. 13, and the connector F can be taken out with the front wall 50 at the full locking position 2P.

As described above, the front wall 50 can be moved along the front surface of the female housing 10 from the full locking position 2P to the partial locking position 1P or to a completely detached position merely by pushing the operable surface 59A exposed at the upper end surface of the front wall 50. Therefore, operability is better.

Further, the upper wall 26 of the mounting frame 27 prevents the front wall 50 from being pushed up beyond the full locking position 2P.

The front wall 50 is formed with the tab insertion holes 51 and the jig insertion holes 52 and is movable between the full locking position 2P and the partial locking position 1P. The tabs 70 can contact the contact points 45A of the female terminal fittings 40 through the tab insertion holes 51 when the front wall 50 is at the full locking position 2P and the detecting pins 60 can contact the detecting plates 46 of the female terminal fittings 40 through the jig insertion holes 52 when the front wall 50 is at the partial locking position 1P. Thus, the tabs 70 and the detecting pins 60 can be guided precisely to the contact points 45A and the detecting plates 46 of the female terminal fittings 40, respectively, thereby improving contact reliability.

The front wall 50 is pushed from the full locking position 2P to the partial locking position 1P as the holder 81 and the detector 82 are brought closer to each other (e.g. by the action of a lever mounted thereon displaying a cam action or the like). Thus, the front wall 50 can be moved during a series of testing cycles by the testing apparatus 80, thereby improving operation efficiency. Similarly, after the test, the front wall 50 is pushed from the partial locking position 1P back to the full locking position 2P as the holder 81 and the detector 82 are separated. Thus, operation efficiency is even better. As a result, a plurality of connectors can be tested successively and quickly. Further, since it is sufficient to set the cam surfaces and the pusher 87 as means for moving the front wall 50, it is not necessary to change the construction of the testing apparatus 80.

Figure 14:
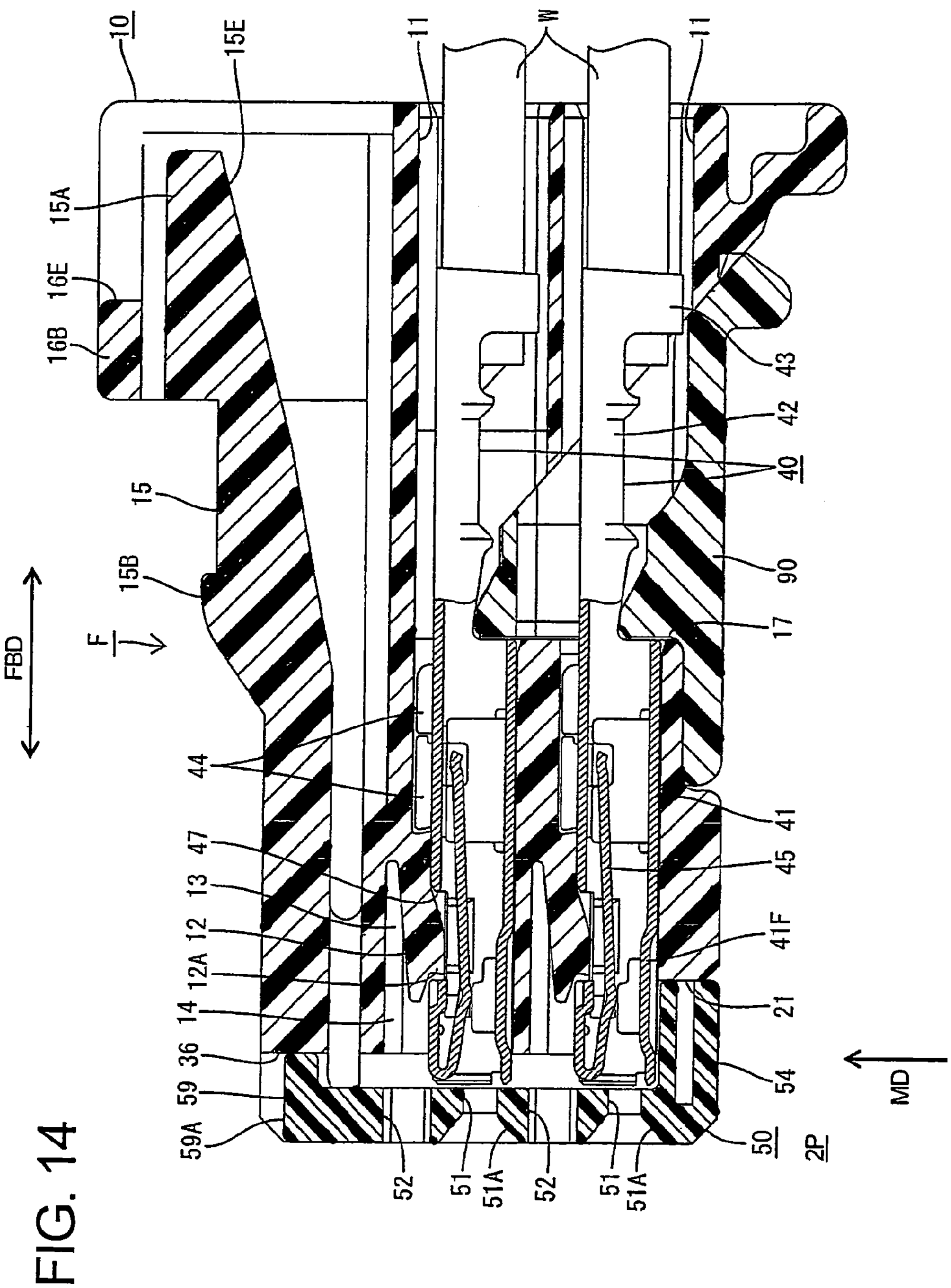
FIG. 14 is a section of a connector according to a second embodiment of the invention when a front wall is at a full locking position.
Figure 15:
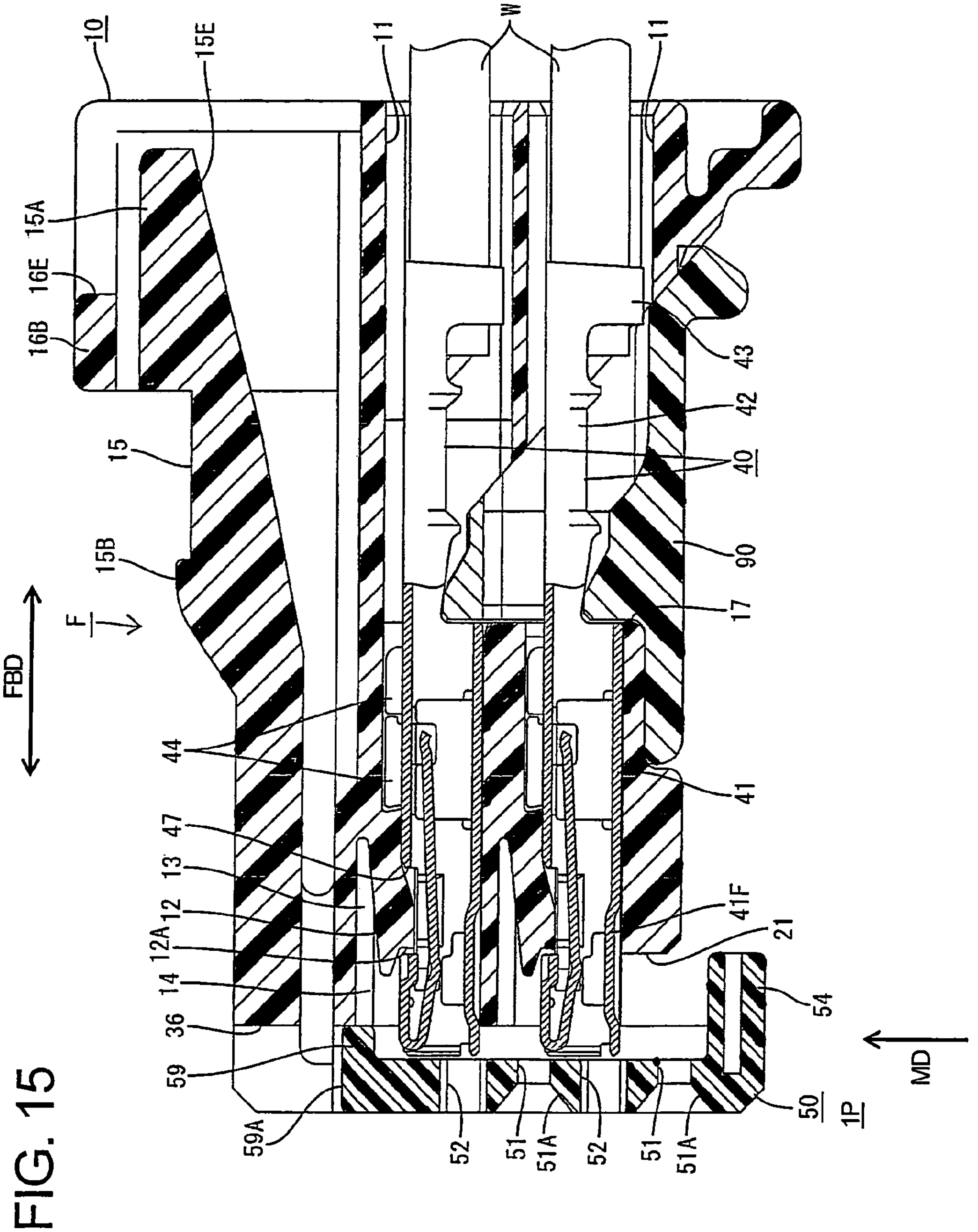
FIG. 15 is a section when the front wall is at a partial locking position.
Figure 16:
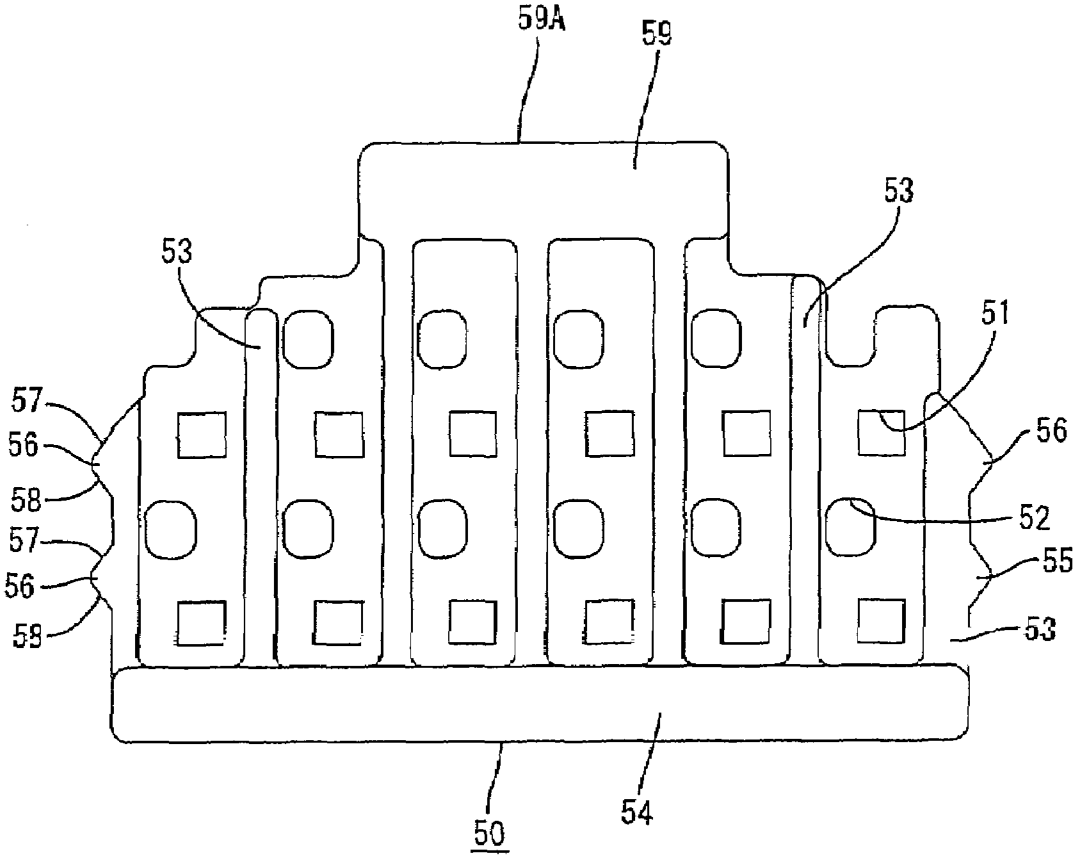
FIG. 16 is a rear view of the front wall.
Figure 17:
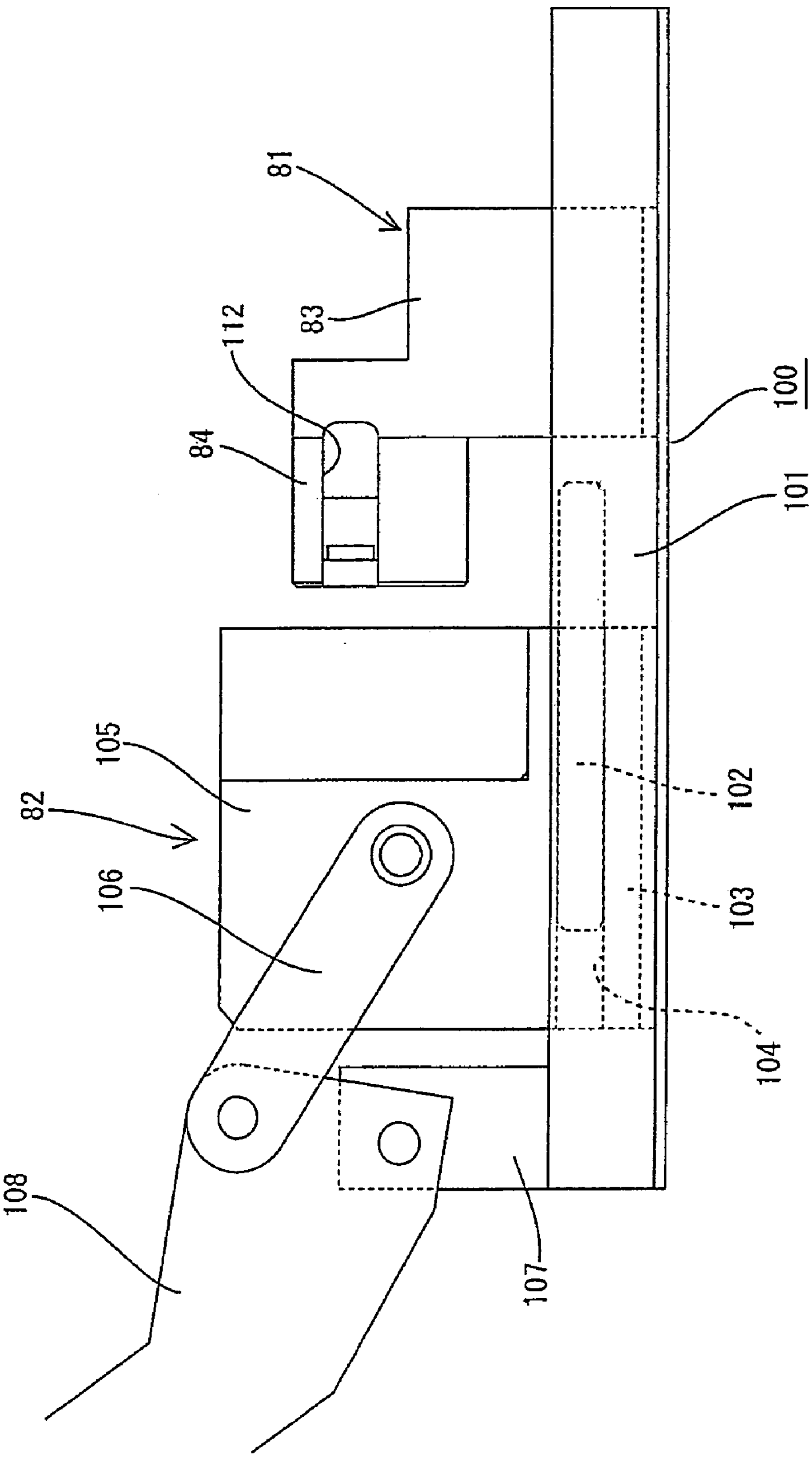
FIG. 17 is a side view showing the entire testing apparatus in detail.

A second embodiment of the invention is described with reference to FIGS. 14 to 16. The second embodiment differs from the first embodiment in the construction of a lower part of the front wall 50, but the other construction is substantially similar or the same as the first embodiment.

A front wall 50 of the second embodiment has a base 54 that extends back at the bottom of the rear surface thereof. The rear surface of the base 54 is more backward than the rear surfaces of vertical ribs 53. A front end portion of the bottom wall of a female housing 10 is cut off to form a recess 21 for receiving the base 54 is insertable from below and along the mounting direction MD when the front wall 50 reaches a full locking position 2P. Further, when the front wall 50 reaches the full locking position 2P, the base 54 can be held in contact with main portions 41 located above it. Thus, the front wall 50 cannot be pushed up any further in the mounting direction MD.

According to the second embodiment, the symmetry of the front wall 50 is lost by the base 54 and the pushable portion 59 functioning as an identifying construction. Thus, the orientation of the front wall 50 along vertical and/or transverse directions can be identified. Therefore, the orientation of the front wall 50 advantageously can be discriminated by an automatic machine upon assembling the front wall 50. This also holds for the first embodiment.

FIGS. 17 to 22 show a more specific construction of the testing apparatus shown in the first preferred embodiment. Parts common or similar to those described in the first embodiment are not described here by being identified by the same reference numerals in FIGS. 17 to 22.

The detector 82 and the holder 81 are arranged on a base 100. Two side walls 101 stand at the substantially opposite longer edges of the base 100, and a guiding projection 102 projects from the inner surface of each side wall 101 over a specified length range.

Figure 19:
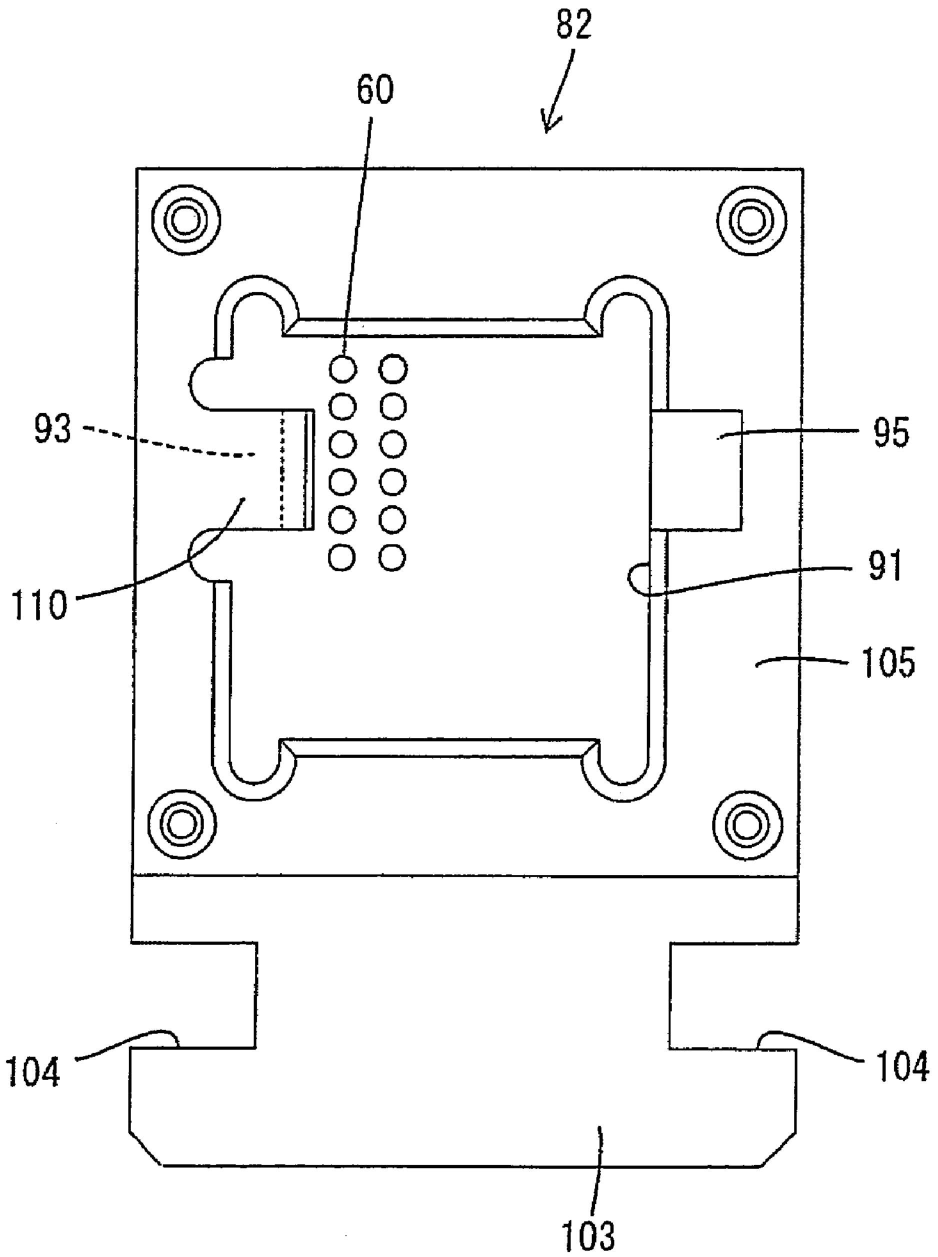
FIG. 19 is a front view of the detecting unit.

As shown in FIG. 19, the detector 82 has a footing 103 at its lower part. The substantially opposite widthwise surfaces of the footing 103 are recessed to form two guiding grooves 104. Both guiding grooves 104 are engaged with the guiding projections 102, so that the detector 82 is movable substantially along the guide projections 102. The detector 82 has a main body 105 on the footing 103, and one end of each connection link 106 is coupled rotatably to the corresponding one of the opposite side surfaces of the main body 105. On the other hand, a supporting block 107 is fixed at the rear end of the upper surface of the base 100, and an operating lever 108 is mounted rotatably on the supporting block 107. The other ends of the connecting links 106 are coupled to the operating lever 108, so that the detector 82 can be moved substantially forward and backward or along the connecting direction CD as the operating lever 108 is rotated.

The receiver 91 for receiving the supporting block 84 of the holder 81 is formed in the main body 105 of the detector 82, and detecting pins 60 project from the back wall of the receiver 91. The detecting pins 60 are at positions corresponding to the respective jig insertion holes 52 when the front wall 50 of the connector F set in the holder 81 is moved to the partial locking position 1P.

Figure 18:
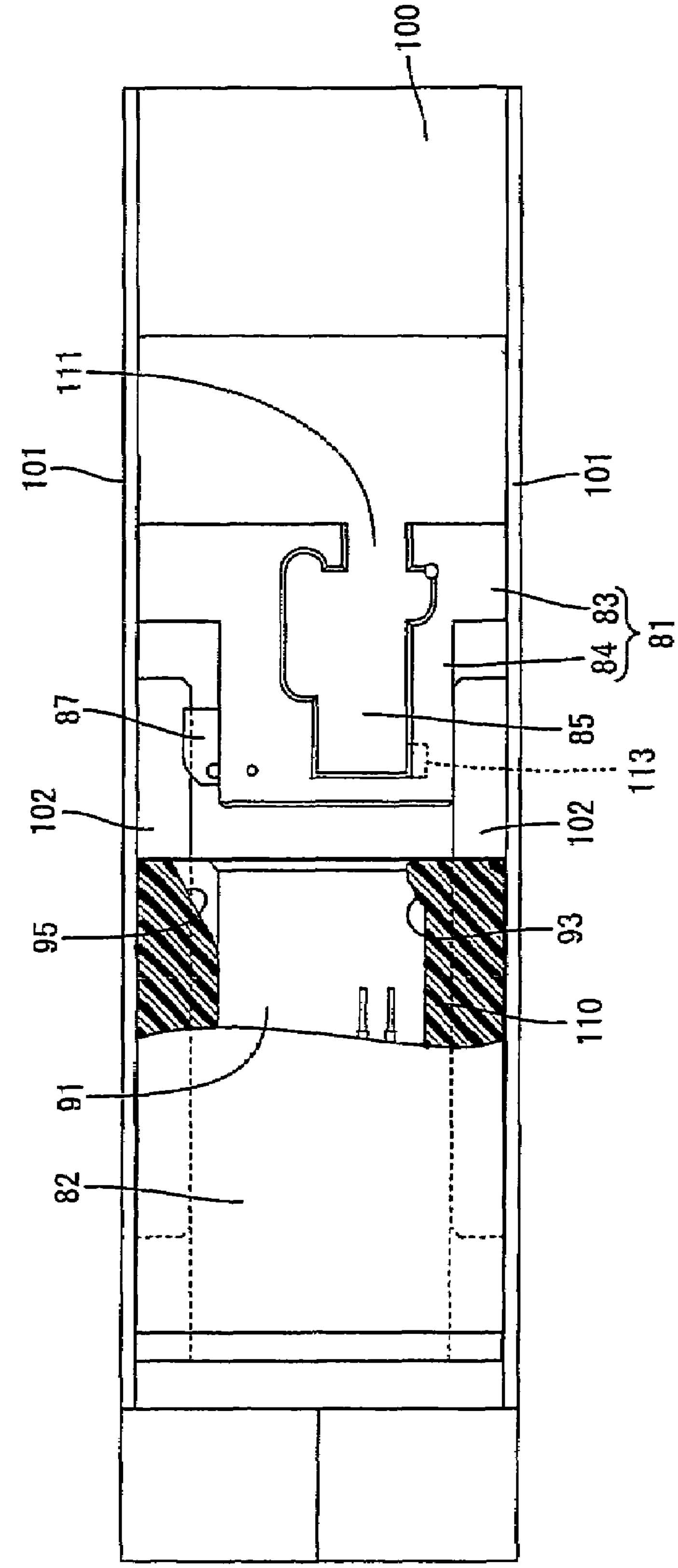
FIG. 18 is a plan view showing the entire testing apparatus without an operating lever and other elements.

Both first and second cam surfaces 93, 95 for moving the front wall 50 between the partial locking position 1P and the full locking position 2P are close to an opening edge of the receiver 91. The first cam surface 93 for returning the front wall 50 from the partial locking position 1P to the full locking position 2P is at a height displaced towards the top at the left opening edge, as shown in FIG. 19. As shown in FIG. 18, a cam projection 110 projects substantially horizontally from the inner wall surface of the receiver 91 inwardly of the receiver 91 over a range from the opening edge to the back wall, and the first cam surface 93 slopes up from the back side towards the opening edge on the inner surface of the leading end of the cam projection 110. The second cam surface 95 for moving the front wall 50 from the full locking position 2P to the partial locking position 1P is formed by obliquely cutting off the right opening edge of FIG. 19 substantially at the same height as the first cam surface 93, and is sloped down from the opening edge toward the back side.

Figure 20:
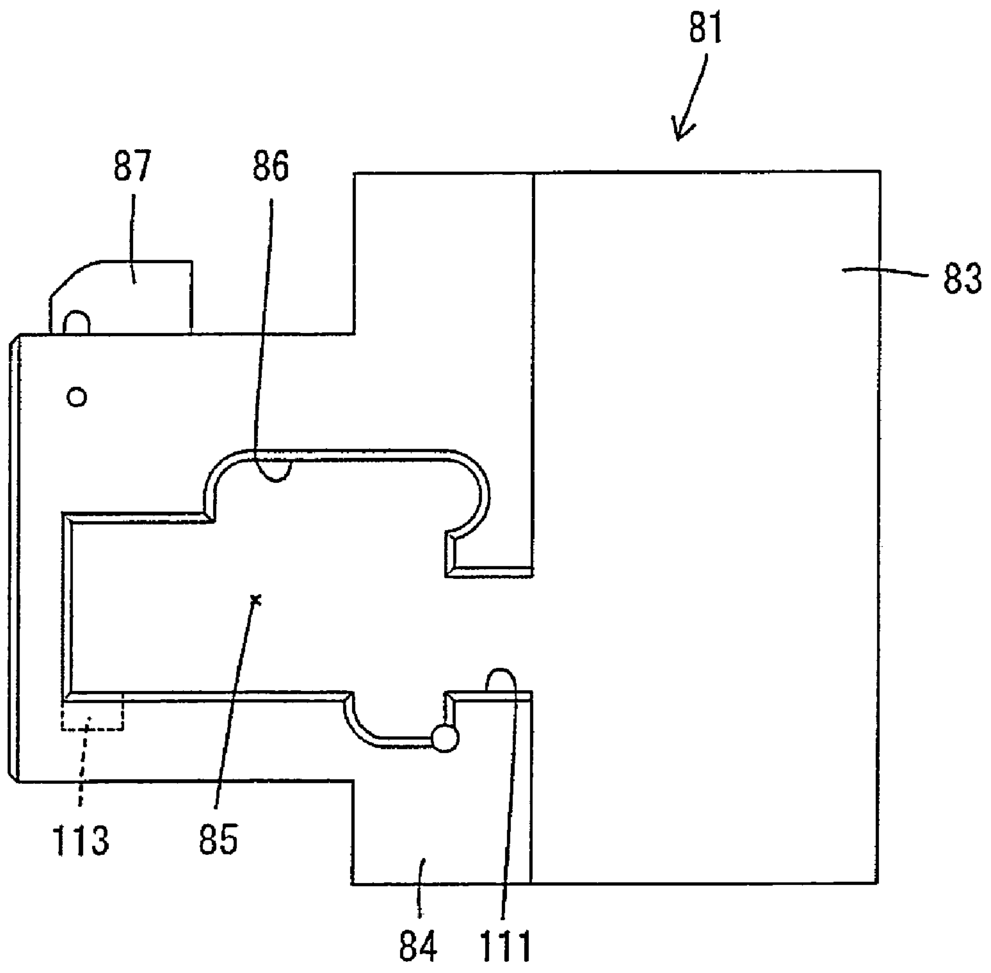
FIG. 20 is a plan view of the holder.
Figure 21:
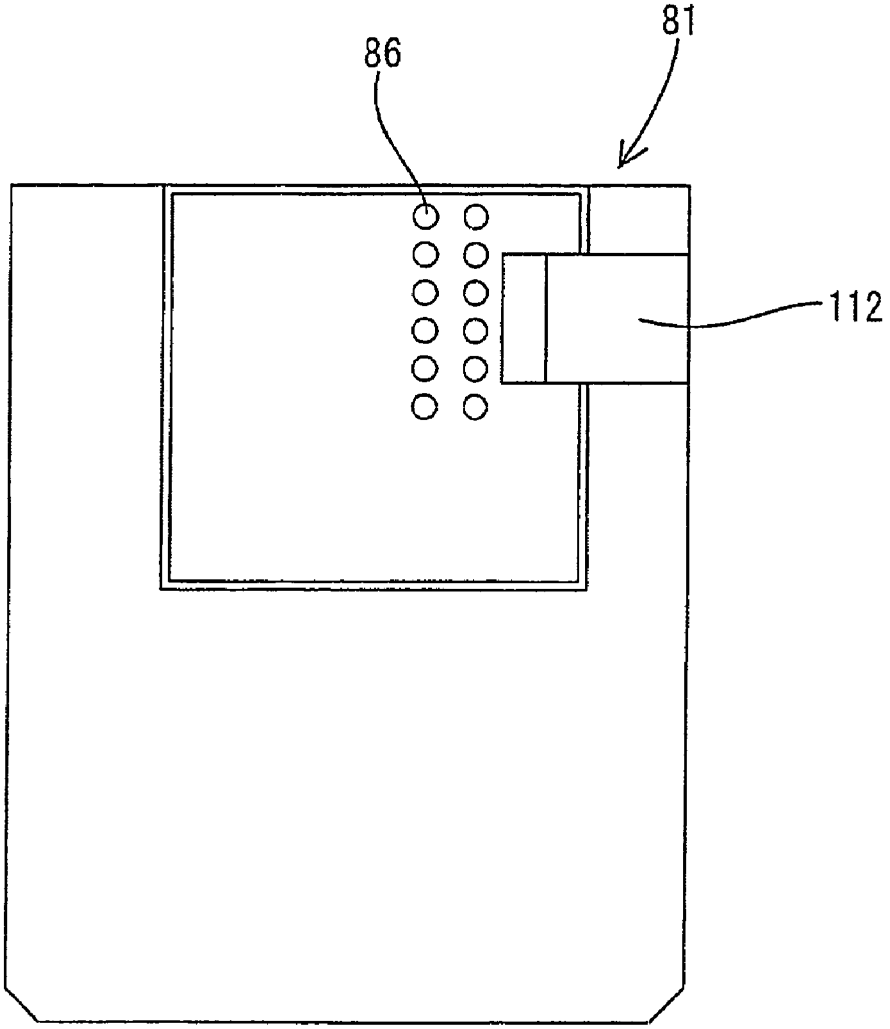
FIG. 21 is a front view of the holder before the pushing member is mounted.
Figure 22:
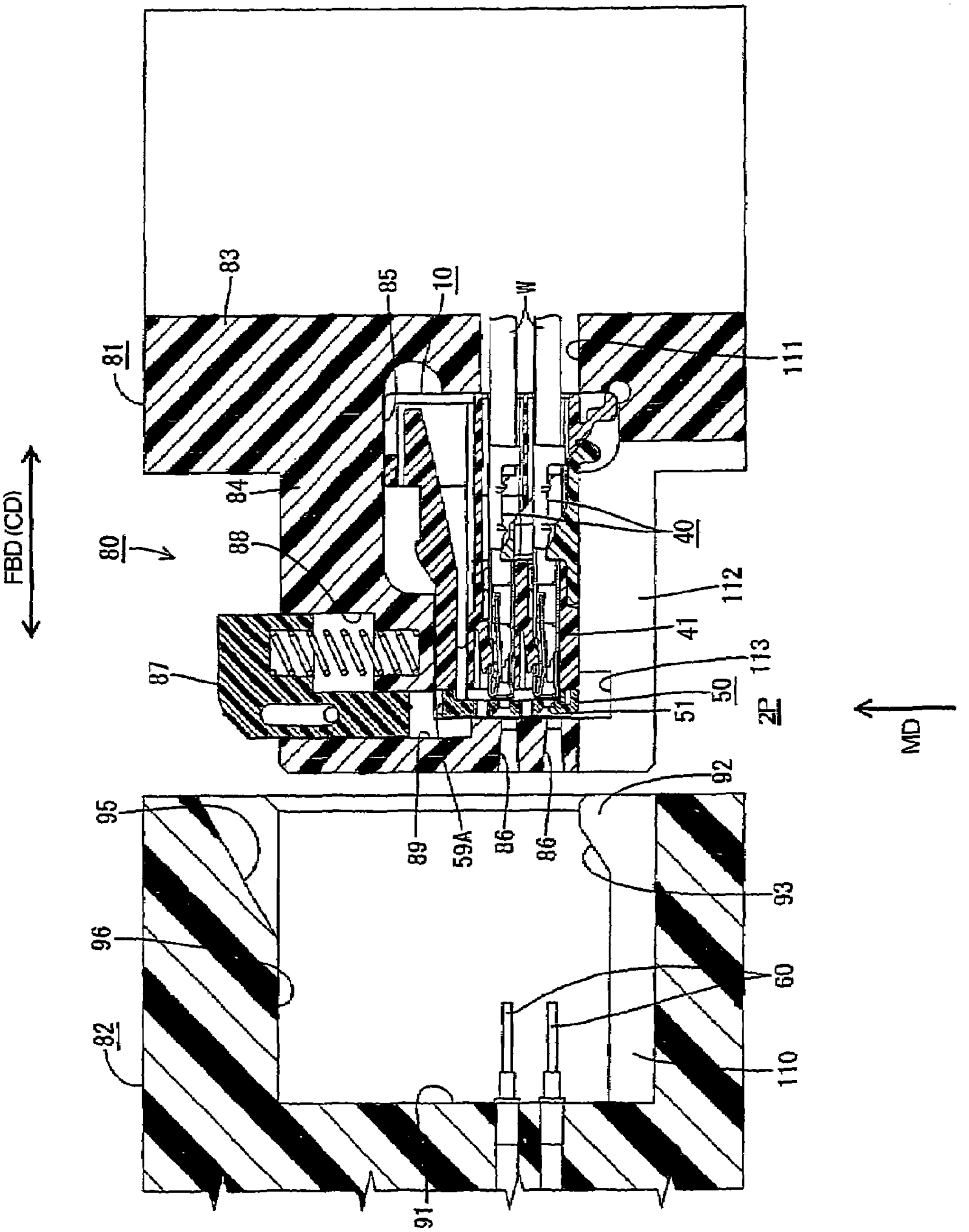
FIG. 22 is a section when the connector is set in the holder in the testing apparatus.

The holder 81 includes the back wall 83 fixed onto the base 100 and the supporting block 84 coupled to an upper part of the front surface of the back wall 83. The supporting block 84 is recessed to form the connector fixing portion 85 for accommodating the connector F. The connector fixing portion 85 is open in the upper surface of the supporting block 84 to form a connector insertion opening 86, as shown in FIG. 20. The connector insertion opening 86 conforms to the outer shape of the connector F with the front wall 50 held at the full locking position 2P. Accordingly, even if an erroneous attempt is made to insert the connector F with the front wall 50 at the partial locking position 1P, part of the front wall 50 interferes with the opening edge of the connector insertion opening 86. Thus, an operator can be informed that the connector F is not in a proper state to be tested, thereby preventing the connector F from being damaged by a forcible testing operation.

The connector fixing portion 85 including the connector insertion opening 86 is open in the rear surface of the holder 81 to form a wire escaping portion 111.

The pusher 87 for moving the front wall 50 to the partial locking position is mounted on one side surface of the supporting block 84, and normally is held at the standby position SP where a rear end portion thereof projects from the supporting block 84 (see FIG. 18). The pusher 87 faces the second cam surface 95 of the detector 82 and slides in contact with the second cam surface 95 as the detector 82 is brought closer to the holder 81 along the connecting direction CD. Thus, the pusher 87 is pushed from the standby position SP to the pushing position PP. An interference avoiding groove 112 is formed along longitudinal direction in the side surface of the supporting block 84 opposite the surface where the pusher 87 is mounted, and communicates with the connector fixing portion 85. This interference avoiding groove 112 receives the first cam surface 93 as the detector 82 is brought closer to the holder 81, and lets the first cam surface 93 pass before the front wall 50 is pushed to avoid interference between the advancing detector 82 and the front wall 50. Further, escaping grooves 113 are formed in the bottom and ceiling surfaces of the interference avoiding groove 112 to avoid interference with the front wall 50 moved to the partial locking position.

The first cam surface 93 moves the front wall 50 at the partial locking position 1P back to the full locking position 2P as the detector 82 is moved away from the holder 81 as in the first embodiment.

The invention is not limited to the above described and illustrated embodiments. For example, the following embodiments are also embraced by the technical scope of the present invention as defined by the claims. Beside the following embodiments, various changes can be made without departing from the scope and spirit of the present invention as defined by the claims.

The front wall may be pushed from the full locking position 2P to the partial locking position 1P by pushing the operable surface by fingers.

It is not necessary to provide the construction for holding the front wall at the partial locking position 1P if no electrical connection test is conducted with the front wall held at the partial locking position 1P.

The electrical connection test may be conducted using parts of the female terminal fittings other than the detecting plates.

The operable surface may be pushed directly without the pusher to push the front wall to the partial locking position 1P as the holder and the detector are brought closer to each other along the connecting direction CD.

The invention is also applicable to male connectors with male terminal fittings.

What is claimed is:

1. A connector, the test apparatus, comprising:

testing apparatus for conducting an electrical connection test on a terminal fitting in a connector, a connector having a housing with at least one cavity and a terminal fitting being in the cavity, the connector further having front wall mounted on the housing and being movable between a first position where a jig insertion hole of the front wall aligns with a detecting portion of the terminal fitting and a second position where a tab insertion hole of the front wall communicates with the cavity;

a holder for receiving the connector;

a detector with at least one detecting pin, at least one of the holder and the detector being relatively movable between a substantially adjacent position where the detecting pin enters the jig insertion hole for conducting the test and separated position where the connector can be placed in or removed from the holder; and pushing means for pushing the operable surface of the connector in the holder for moving the front wall from the second position to the first position as the holder and the detector are moved to the substantially adjacent position, wherein the detecting pin enters the jig insertion hole after the front wall is pushed to the first position by the pushing means.

2. The connector testing apparatus of claim 1, further comprising pushing-back means for pushing the front wall from the first position to the second position as the holder and the detector are moved to the separated position.

3. The connector testing apparatus of claim 2, wherein the pushing-back means includes a first cam surface in the detector, the front wall being movable substantially along the first cam surface from the first position to the second position.

4. The connector testing apparatus of claim 3, wherein the pushing means includes a second cam surface (92) in the detector and a pusher in the holder, the pusher being movable along the second cam surface to push the operable surface for moving the front wall from the second position to the first position.

5. A electrical connector testing method, comprising:

providing a connector with a housing having at least one cavity, a terminal fitting in the cavity, a front wall mounted on the housing and movable between a first position where a jig insertion hole aligns with a detecting portion of the terminal fitting and a second position where a tab insertion hole (51) communicates with the cavity;

placing the connector in a holder of a testing apparatus while the front wall is in the second position;

moving the front wall from the second position to the first position with the connector in the holder; and inserting a detecting pin of the testing apparatus through the jig insertion hole to conduct an electrical connection test on the terminal fitting in the cavity.

6. The connector testing method of claim 5, further comprising moving front wall from the first position back to the second position while retracting the detecting pin from the jig insertion hole after the electrical connection test and while the connector is in the holder.

7. The connector testing method of claim 6, wherein the front wall is moved from the second position to the first position as the detecting pin is brought closer to the housing and is moved back again to the second position as the detecting pin is retracted.

* * * * *